(12) United States Patent
Disney et al.

(10) Patent No.: US 7,902,630 B2
(45) Date of Patent: Mar. 8, 2011

(54) ISOLATED BIPOLAR TRANSISTOR

(75) Inventors: Donald R. Disney, Cupertino, CA (US); Richard K. Williams, Cupertino, CA (US)

(73) Assignee: Advanced Analogic Technologies, Inc., Santa Clara, CA (US)

( * ) Notice: Subject to any disclaimer, the term of this patent is extended or adjusted under 35 U.S.C. 154(b) by 446 days.

(21) Appl. No.: 12/069,940

(22) Filed: Feb. 14, 2008

(65) Prior Publication Data

US 2008/0217699 A1   Sep. 11, 2008

Related U.S. Application Data

(60) Continuation-in-part of application No. 11/890,993, filed on Aug. 8, 2007, which is a continuation of application No. 11/444,102, filed on May 31, 2006, now Pat. No. 7,825,488, and a continuation-in-part of application No. 10/918,316, filed on Aug. 14, 2004, now Pat. No. 7,422,938, which is a division of application No. 10/218,668, filed on Aug. 14, 2002, now Pat. No. 6,900,091, said application No. 11/890,993 and a continuation-in-part of application No. 11/204,215, filed on Aug. 15, 2005, now Pat. No. 7,489,016, is a division of application No. 10/218,678, filed on Aug. 14, 2002, now Pat. No. 6,943,426.

(51) Int. Cl.
*H01L 29/73* (2006.01)

(52) U.S. Cl. ............... 257/517; 257/197; 257/477

(58) Field of Classification Search .......... 257/517, 257/477, 197
See application file for complete search history.

(56) References Cited

U.S. PATENT DOCUMENTS

| | | | |
|---|---|---|---|
| 4,269,636 A | 5/1981 | Rivoli et al. | 438/359 |
| 4,454,647 A | 6/1984 | Joy et al. | 29/576 |
| 4,478,655 A | 10/1984 | Nagakubo et al. | 148/175 |
| 4,642,883 A | 2/1987 | Sakurai et al. | 438/362 |
| 4,655,875 A | 4/1987 | Wada et al. | 438/514 |
| 4,819,052 A | 4/1989 | Hutter | 257/378 |
| 4,980,747 A | 12/1990 | Hutter et al. | 357/50 |
| 5,157,419 A | 10/1992 | Matsumoto et al. | 347/59 |
| 5,324,973 A | 6/1994 | Sivan | 257/330 |
| 5,374,569 A | 12/1994 | Yilmaz et al. | 437/34 |
| 5,386,136 A | 1/1995 | Williams et al. | 257/409 |
| 5,410,175 A | 4/1995 | Kyomasu et al. | 257/458 |
| 5,420,061 A | 5/1995 | Manning | 438/218 |
| 5,485,027 A | 1/1996 | Williams et al. | 257/343 |
| 5,506,431 A | 4/1996 | Thomas | 365/185.15 |
| 5,525,824 A | 6/1996 | Himi et al. | 257/370 |
| 5,557,135 A | 9/1996 | Hashimoto | 257/308 |

(Continued)

FOREIGN PATENT DOCUMENTS

EP   0 589 675 A2   3/1994

(Continued)

*Primary Examiner* — Thao X Le
*Assistant Examiner* — Tanika Warrior
(74) *Attorney, Agent, or Firm* — Patentability Associates

(57) ABSTRACT

An isolated bipolar transistor formed in a P-type semiconductor substrate includes an N-type submerged floor isolation region and a filled trench extending downward from the surface of the substrate to the floor isolation region. Together the floor isolation region and the filled trench form an isolated pocket of the substrate which contains the bipolar transistor. The collector of the bipolar transistor may comprise the floor isolation region. The substrate does not contain an epitaxial layer, thereby overcoming the many problems associated with fabricating the same.

17 Claims, 24 Drawing Sheets

U.S. PATENT DOCUMENTS

| | | | | |
|---|---|---|---|---|
| 5,668,397 A | 9/1997 | Davis et al. | | 257/520 |
| 5,684,305 A | 11/1997 | Pearce | | 257/48 |
| 5,807,783 A | 9/1998 | Gaul et al. | | 438/406 |
| 5,883,413 A | 3/1999 | Ludikhuize | | 257/343 |
| 5,892,264 A | 4/1999 | Davis et al. | | 257/511 |
| 5,914,523 A | 6/1999 | Bashir et al. | | 257/520 |
| 5,970,356 A * | 10/1999 | Jeon | | 438/361 |
| 5,986,863 A | 11/1999 | Oh | | 361/56 |
| 5,993,677 A | 11/1999 | Biasse et al. | | 216/36 |
| 6,013,936 A | 1/2000 | Colt | | 257/506 |
| 6,130,458 A | 10/2000 | Takagi et al. | | 257/351 |
| 6,144,086 A | 11/2000 | Brown et al. | | 257/510 |
| 6,163,052 A | 12/2000 | Liu et al. | | 257/334 |
| 6,171,982 B1 | 1/2001 | Sata | | 438/795 |
| 6,225,674 B1 | 5/2001 | Lim et al. | | 257/506 |
| 6,316,336 B1 | 11/2001 | Blanchard | | 438/478 |
| 6,331,456 B1 | 12/2001 | Wu | | 438/154 |
| 6,383,892 B1 | 5/2002 | Colt | | 438/457 |
| 6,559,505 B1 | 5/2003 | Fallica | | 257/350 |
| 6,657,262 B2 | 12/2003 | Patti | | 257/370 |
| 6,740,958 B2 | 5/2004 | Nakazato et al. | | 257/550 |
| 6,855,985 B2 | 2/2005 | Williams et al. | | 257/338 |
| 6,900,091 B2 | 5/2005 | Williams et al. | | 438/228 |
| 6,943,426 B2 | 9/2005 | Williams et al. | | 257/500 |
| 7,009,271 B1 | 3/2006 | Thurgate et al. | | 257/510 |
| 7,049,663 B2 | 5/2006 | Wang | | 257/355 |
| 7,176,548 B2 | 2/2007 | Williams et al. | | 257/500 |
| 7,183,610 B2 | 2/2007 | Pattanayak et al. | | 257/333 |
| 7,268,045 B2 | 9/2007 | Hower et al. | | 438/282 |
| 7,576,388 B1 | 8/2009 | Wilson et al. | | 257/330 |
| 2001/0000288 A1 | 4/2001 | Oh | | 257/409 |
| 2001/0013636 A1 | 8/2001 | Dunn et al. | | 257/565 |
| 2001/0015459 A1 | 8/2001 | Watanabe et al. | | 257/341 |
| 2002/0008299 A1 | 1/2002 | Leonardi | | 257/520 |
| 2002/0079555 A1 | 6/2002 | Okawa et al. | | 257/513 |
| 2002/0084506 A1 | 7/2002 | Voldman et al. | | 257/511 |
| 2003/0057498 A1 | 3/2003 | Yamashita | | 257/369 |
| 2003/0107103 A1 | 6/2003 | Iwata et al. | | 257/506 |
| 2003/0168712 A1 | 9/2003 | Shin et al. | | 257/510 |
| 2004/0026746 A1 | 2/2004 | Nakazawa et al. | | 257/374 |
| 2004/0032005 A1 | 2/2004 | Williams et al. | | 257/510 |
| 2004/0033666 A1 | 2/2004 | Williams et al. | | 438/297 |
| 2004/0071030 A1 | 4/2004 | Goda et al. | | 365/222 |
| 2005/0014324 A1 | 1/2005 | Williams et al. | | 438/200 |
| 2005/0014329 A1 | 1/2005 | Williams et al. | | 438/318 |
| 2005/0087805 A1 | 4/2005 | Ning | | 257/350 |
| 2005/0142724 A1 | 6/2005 | Williams et al. | | 438/199 |
| 2005/0142791 A1 | 6/2005 | Williams et al. | | 438/369 |
| 2005/0142792 A1 | 6/2005 | Williams et al. | | 438/369 |
| 2005/0158939 A1 | 7/2005 | Williams et al. | | 438/199 |
| 2005/0179093 A1 | 8/2005 | Morris | | 257/371 |
| 2005/0179111 A1 | 8/2005 | Chao | | 257/510 |
| 2005/0189606 A1 | 9/2005 | Nakagawa | | 257/500 |
| 2005/0272207 A1 | 12/2005 | Williams et al. | | 438/261 |
| 2005/0272230 A1 | 12/2005 | Williams et al. | | 438/510 |
| 2005/0287765 A1 | 12/2005 | Onai et al. | | 438/438 |
| 2006/0038237 A1 | 2/2006 | Flotfi et al. | | 257/369 |
| 2006/0076629 A1 | 4/2006 | Yilmaz | | 257/378 |
| 2006/0175635 A1 | 8/2006 | Arai et al. | | 257/197 |
| 2006/0223257 A1 | 10/2006 | Williams et al. | | 438/202 |
| 2006/0273403 A1 | 12/2006 | Suzuki et al. | | 257/371 |
| 2007/0013021 A1 | 1/2007 | Zhang | | 257/500 |
| 2007/0132056 A1 | 6/2007 | Williams et al. | | 257/510 |
| 2007/0158779 A1 | 7/2007 | Cannon et al. | | 257/500 |
| 2007/0241421 A1 | 10/2007 | Liu et al. | | 257/510 |
| 2007/0278568 A1 | 12/2007 | Williams et al. | | 257/335 |
| 2007/0278612 A1 | 12/2007 | Williams et al. | | 257/338 |
| 2008/0042232 A1 | 2/2008 | Williams et al. | | 257/338 |
| 2008/0044978 A1 | 2/2008 | Williams et al. | | 257/338 |
| 2008/0048287 A1 | 2/2008 | Williams et al. | | 257/338 |
| 2008/0191277 A1 | 8/2008 | Disney et al. | | 257/327 |
| 2008/0197408 A1 | 8/2008 | Disney et al. | | 257/335 |
| 2008/0197445 A1 | 8/2008 | Disney et al. | | 257/272 |
| 2008/0197446 A1 | 8/2008 | Disney et al. | | 257/499 |
| 2008/0210980 A1 | 9/2008 | Disney et al. | | 257/204 |
| 2008/0213972 A1 | 9/2008 | Disney et al. | | 438/430 |
| 2008/0230812 A1 | 9/2008 | Disney et al. | | 257/272 |
| 2008/0237656 A1 | 10/2008 | Williams et al. | | 257/262 |
| 2008/0237704 A1 | 10/2008 | Williams et al. | | 257/338 |
| 2008/0237706 A1 | 10/2008 | Williams et al. | | 257/343 |
| 2008/0237782 A1 | 10/2008 | Williams et al. | | 257/499 |
| 2008/0237783 A1 | 10/2008 | Williams et al. | | 257/513 |
| 2008/0290449 A1 | 11/2008 | Williams et al. | | 257/513 |
| 2008/0290450 A1 | 11/2008 | Williams et al. | | 257/513 |
| 2008/0290451 A1 | 11/2008 | Williams et al. | | 257/513 |
| 2009/0020811 A1 | 1/2009 | Voldman | | 257/337 |
| 2009/0101937 A1 | 4/2009 | Lee et al. | | 257/137 |
| 2009/0236683 A1 | 9/2009 | Williams et al. | | 257/499 |

FOREIGN PATENT DOCUMENTS

| | | |
|---|---|---|
| EP | 1357598 A1 | 10/2003 |
| GB | 2 362 508 | 11/2001 |
| KR | 10-0456691 | 11/2008 |

* cited by examiner

Key To FIG. 1

| FIG. 1A |
| FIG. 1B |

ISOLATED BIPOLAR TRANSISTOR

CROSS-REFERENCE TO RELATED APPLICATIONS

This application is a continuation-in-part of application Ser. No. 11/890,993, filed Aug. 8, 2007. application Ser. No. 11/890,993 is a continuation of application Ser. No. 11/444,102, filed May 31, 2006, and a continuation-in-part of the following applications: (a) application Ser. No. 10/918,316, filed Aug. 14, 2004, which is a divisional of application Ser. No. 10/218,668, filed Aug. 14, 2002, now U.S. Pat. No. 6,900,091, and (b) application Ser. No. 11/204,215, filed Aug. 15, 2005, which is a divisional of application Ser. No. 10/218,678, filed Aug. 14, 2002, now U.S. Pat. No. 6,943,426. Each of the foregoing applications and patents is incorporated herein by reference in its entirety.

BACKGROUND OF THE INVENTION

In the fabrication of semiconductor integrated circuit (IC) chips, it is frequently necessary to electrically isolate different devices from the semiconductor substrate and from each other. One method of providing lateral isolation among devices is the well-known Local Oxidation Of Silicon (LOCOS) process, wherein the surface of the chip is masked with a relatively hard material such as silicon nitride and a thick oxide layer is grown thermally in an opening in the mask. Another way is to etch a trench in the silicon and then fill the trench with a dielectric material such as silicon oxide, also known as trench isolation. While both LOCOS and trench isolation can prevent unwanted surface conduction between devices, they do not facilitate complete electrical isolation.

Complete electrical isolation is necessary to integrate certain types of transistors including bipolar junction transistors and various metal-oxide-semiconductor (MOS) transistors including power DMOS transistors. Complete isolation is also needed to allow CMOS control circuitry to float to potentials well above the substrate potential during operation. Complete isolation is especially important in the fabrication of analog, power, and mixed signal integrated circuits.

Although conventional CMOS wafer fabrication offers high density transistor integration, it does not facilitate complete electrical isolation of its fabricated devices. In particular, the NMOS transistor contained in a conventional CMOS transistor pair fabricated in a P-type substrate has its P-well "body" or "back-gate" shorted to the substrate and therefore cannot float above ground. This restriction is substantial, preventing the use of the NMOS as a high-side switch, an analog pass transistor, or as a bidirectional switch. It also makes current sensing more difficult and often precludes the use of integral source-body shorts needed to make the NMOS more avalanche rugged. Moreover since the P-type substrate in a conventional CMOS is normally biased to the most negative on-chip potential (defined as "ground"), every NMOS is necessarily subjected to unwanted substrate noise.

Complete electrical isolation of integrated devices has typically been achieved using triple diffusions, epitaxial junction isolation, or dielectric isolation. The most common form of complete electrical isolation is junction isolation. While not as ideal as dielectric isolation, where oxide surrounds each device or circuit, junction isolation has historically offered the best compromise between manufacturing cost and isolation performance.

With conventional junction isolation, electrically isolating a CMOS requires a complex structure comprising the growth of an N-type epitaxial layer atop a P-type substrate surrounded by an annular ring of deep P-type isolation electrically connecting to the P-type substrate to form a completely isolated N-type epitaxial island having P-type material below and on all sides. Growth of epitaxial layers is slow and time consuming, representing the single most expensive step in semiconductor wafer fabrication. The isolation diffusion is also expensive, performed using high temperature diffusion for extended durations (up to 18 hours). To be able to suppress parasitic devices, a heavily-doped N-type buried layer (NBL) must also be masked and selectively introduced prior to epitaxial growth.

To minimize up-diffusion during epitaxial growth and isolation diffusion, a slow diffuser such as arsenic (As) or antimony (Sb) is chosen to form the N-type buried layer (NBL). Prior to epitaxial growth however, this NBL layer must be diffused sufficiently deep to reduce its surface concentration, or otherwise the concentration control of the epitaxial growth will be adversely impacted. Because the NBL is comprised of a slow diffuser, this pre-epitaxy diffusion process can take more than ten hours. Only after isolation is complete, can conventional CMOS fabrication commence, adding considerable time and complexity to the manufacturing of junction isolated processes compared to conventional CMOS processes.

Junction isolation fabrication methods rely on high temperature processing to form deep diffused junctions and to grow the epitaxial layer. These high temperature processes are expensive and difficult to perform, and they are incompatible with large diameter wafer manufacturing, exhibiting substantial variation in device electrical performance and preventing high transistor integration densities. Another disadvantage of junction isolation is the area wasted by the isolation structures and otherwise not available for fabricating active transistors or circuitry. As a further complication, with junction isolation, the design rules (and the amount of wasted area) depend on the maximum voltage of the isolated devices. Obviously, conventional epitaxial junction isolation, despite its electrical benefits, is too area wasteful to remain a viable technology option for mixed signal and power integrated circuits.

An alternative method for isolating integrated circuit devices is disclosed in U.S. Pat. No. 6,855,985, which is incorporated herein by reference. The modular process disclosed therein for integrating fully-isolated CMOS, bipolar and DMOS (BCD) transistors can be achieved without the need for high temperature diffusions or epitaxy. This modular BCD process uses high-energy (MeV) ion implantation through contoured oxides to produce self-forming isolation structures with virtually no high temperature processing required. This low-thermal budget process benefits from "as-implanted" dopant profiles that undergo little or no dopant redistribution since no high temperature processes are employed.

Dopants, implanted through a LOCOS field oxide, form conformal isolation structures that in turn are used to enclose and isolate multi-voltage CMOS, bipolar transistors and other devices from the common P-type substrate. The same process is able to integrated bipolar transistors, and a variety of double junction DMOS power devices, all tailored using conformal and chained ion implantations of differing dose and energy.

While this "epi-less" low thermal budget technique has many advantages over non-isolated and epitaxial junction isolation processes, in some cases its reliance on LOCOS may impose certain limitations on its ability to scale to smaller dimensions and higher transistor densities. The principle of conformal ion implantation in the LOCOS based modular BCD process is that by implanting through a thicker oxide layer dopant atoms will be located closer to the silicon surface and by implanting through a thinner oxide layer, the implanted atoms will be located deeper in the silicon, away from the surface.

As described, a fully-isolated BCD process with implants contoured to LOCOS, while easily implemented using a 0.35 micron based technology, may encounter problems when scaled to smaller dimensions and tighter line widths. To improve CMOS transistor integration density, it may be preferable to reduce the bird's beak taper of the field oxide layer to a more vertical structure so that the devices can placed more closely for higher packing densities. The narrow LOCOS bird's beak however may cause the width of the isolation sidewall to become narrowed and isolation quality may be sacrificed.

In situations where these problems are significant, it would be desirable to have a new strategy for fully isolating integrated circuit devices that uses a low-thermal-budget, epi-less integrated circuit process, but one that eliminates the narrow sidewall problem described above to allow more compact isolation structures. New trench isolated structures and processes are disclosed in the parent application Ser. No. 11/890, 993. The present disclosure describes isolated CMOS transistors and bipolar transistors, as well as processes for fabricating the isolation structures themselves, that are compatible with this novel approach to trench isolation.

BRIEF SUMMARY OF THE INVENTION

Isolated CMOS transistors of this invention are formed in an isolated pocket of the substrate, which is bounded by a floor isolation region of opposite conductivity type to the substrate and a filled trench extending downward from the surface of the substrate at least to the floor isolation region. The filled trench comprises a dielectric material and may be completely filled with the dielectric material or may have walls lined with the dielectric material and include a conductive material extending from the surface of the substrate to the floor isolation region. The substrate does not include an epitaxial layer, avoiding the many problems described above.

The isolated pocket includes an N-well, which contains a P-channel MOSFET, and a P-well, which contains an N-channel MOSFET. The N- and P-wells may have a non-monotonic doping profile, wherein a lower portion of the well has a higher peak doping concentration than an upper portion of the well. The MOSFETs may include lightly-doped drain extensions. The wells may be separated by filled trenches.

The isolated pocket may include an additional well extending downward from the surface of the substrate to the floor isolation region to provide electrical contact with the floor isolation region.

A plurality of isolated CMOS pairs may be provided, with each CMOS pair being formed in an isolated pocket as described above. A CMOS pair in one isolated pocket may have a higher voltage rating than a CMOS pair in a second isolated pocket. For example, the gate oxide layer of a MOSFET in one of the isolated pockets may be thicker than the gate oxide layer of a second MOSFET in one of the other pockets. A MOSFET in one pocket may be formed in a well that is deeper than or has a lower surface doping concentration than a corresponding well in one of the other pockets.

To provide additional isolation, the P-well and N-well in an isolated pocket may be separated by an additional filled trench that comprises a dielectric material.

Isolated bipolar transistors in accordance with this invention are formed in an isolated pocket of the substrate, which is bounded by a floor isolation region of opposite conductivity type to the substrate and a filled trench extending downward from the surface of the substrate at least to the floor isolation region. The filled trench comprises a dielectric material and may be completely filled with the dielectric material or may have walls lined with the dielectric material and include a conductive material extending from the surface of the substrate to the floor isolation region. The substrate does not include an epitaxial layer, avoiding the many problems described above.

In some embodiments, wherein the base of the bipolar transistor is of the same conductivity type as the substrate, the floor isolation region serves as the collector of the bipolar transistor. In other embodiment, a separate collector region is formed in the isolated pocket. An emitter region and one or more base contact regions may be formed in the isolated pocket at the surface of the substrate and may be separated by one or more STI trenches. The emitter and base regions may be regions that are formed in the same process step as regions of other devices (e.g., MOSFETs), or they may be dedicated regions designed to optimize the performance of the bipolar transistor. The isolated pocket may include an additional well extending downward from the surface of the substrate to the floor isolation region to provide electrical contact with the floor isolation region.

The invention also comprises isolation structures. In one embodiment, the isolation structure includes a floor isolation region submerged in the substrate; a filled trench extending downward from a surface of the substrate at least to the floor isolation region, the filled trench comprising a dielectric material, the floor isolation region and the filled trench together enclosing an isolated pocket of the substrate; a partition trench in the isolated pocket, the partition trench comprising a dielectric material and extending downward from the surface of the substrate at least to the floor isolation region so as to separate the isolated pocket into first and second parts; and a doped well in the first part of the isolated pocket, the well extending downward from the surface of the substrate to the floor isolation region.

In other embodiment, the isolation structure comprises a floor isolation region submerged in the substrate; a filled trench extending downward from a surface to the floor isolation region, the filled trench comprising a conductive material, the conductive material laterally surrounded by a dielectric material, the floor isolation region and the filled trench together enclosing an isolated pocket of the substrate; and a partition trench in the isolated pocket, the partition trench comprising a dielectric material.

The invention also comprises processes for forming isolation structures.

One process comprises forming a first mask layer above a surface of a semiconductor substrate of a first conductivity type; patterning the first mask layer to form a first opening in the first mask layer; implanting a dopant of a second conductivity type through the opening in the first mask layer so as to form a floor isolation region, the floor isolation region having an upper boundary below the surface of the substrate; forming a second mask layer above the surface of the substrate within the opening in the first mask layer, an edge of the second mask layer being separated from an edge of the first opening in the first mask layer to create a gap; etching the substrate through the gap to form a trench, the trench extending downward at least to the floor isolation region; and introducing a dielectric material into the trench so as to form an isolated pocket of the substrate.

A second process comprises forming a trench in the substrate, the trench extending downward from a surface of the substrate; introducing a dielectric material into the trench to create a filled trench; after introducing a dielectric material into the trench, forming a mask layer on the surface of the substrate, the mask layer having an opening, the opening having an edge atop the filled trench; implanting a dopant of a second conductivity type through the opening in the mask layer so as to form a floor isolation region having an upper boundary below a surface of the substrate, the floor isolation region extending from the trench and enclosing an isolated pocket of the substrate.

A third process comprises forming a first trench in the substrate, the first trench extending downward from a surface of the substrate; forming a second trench in the substrate, the second trench extending downward from a surface of the substrate and being wider than the first trench; depositing a dielectric material, the dielectric material being deposited to a sufficient thickness such that the dielectric material fills the first trench but does not fill the second trench, the dielectric material forming a dielectric layer on the sidewalls and floor of the second trench; removing the dielectric layer from the floor of the second trench while leaving a sidewall dielectric layer on the sidewalls of the second trench; implanting a dopant of a second conductivity type into the substrate to form a floor isolation region having an upper boundary below the surface of the substrate, the floor of the second trench being located in the floor isolation region, the second trench and the floor isolation region enclosing an isolated pocket of the substrate; and introducing a conductive material into the second trench, the conductive material extending downward from a mouth of the trench and being in electrical contact with the floor isolation region.

The principles of this invention will become clearer from the following detailed description when read in conjunction with the following drawings, in which similar components have the same reference numerals.

DETAILED DESCRIPTION OF THE INVENTION

Initially, various isolated CMOS and bipolar transistors that can be fabricated in accordance with this invention will be described. This will be followed by a description of alternative process flows for fabricating the isolation structures.

Figure 1A:
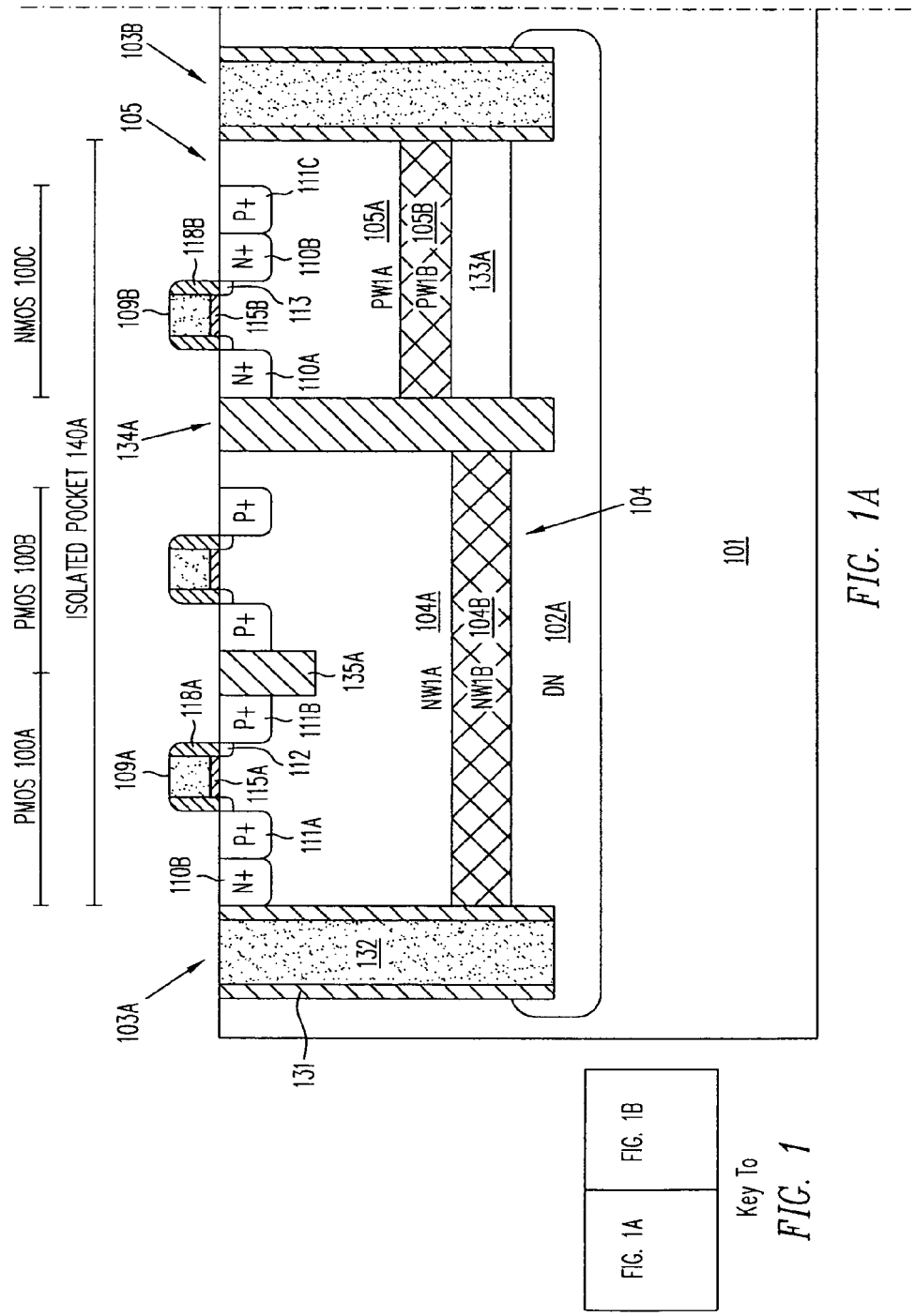
FIG. 1 illustrates a cross-sectional view of CMOS devices fabricated according to one embodiment of the present invention.
Figure 1B:
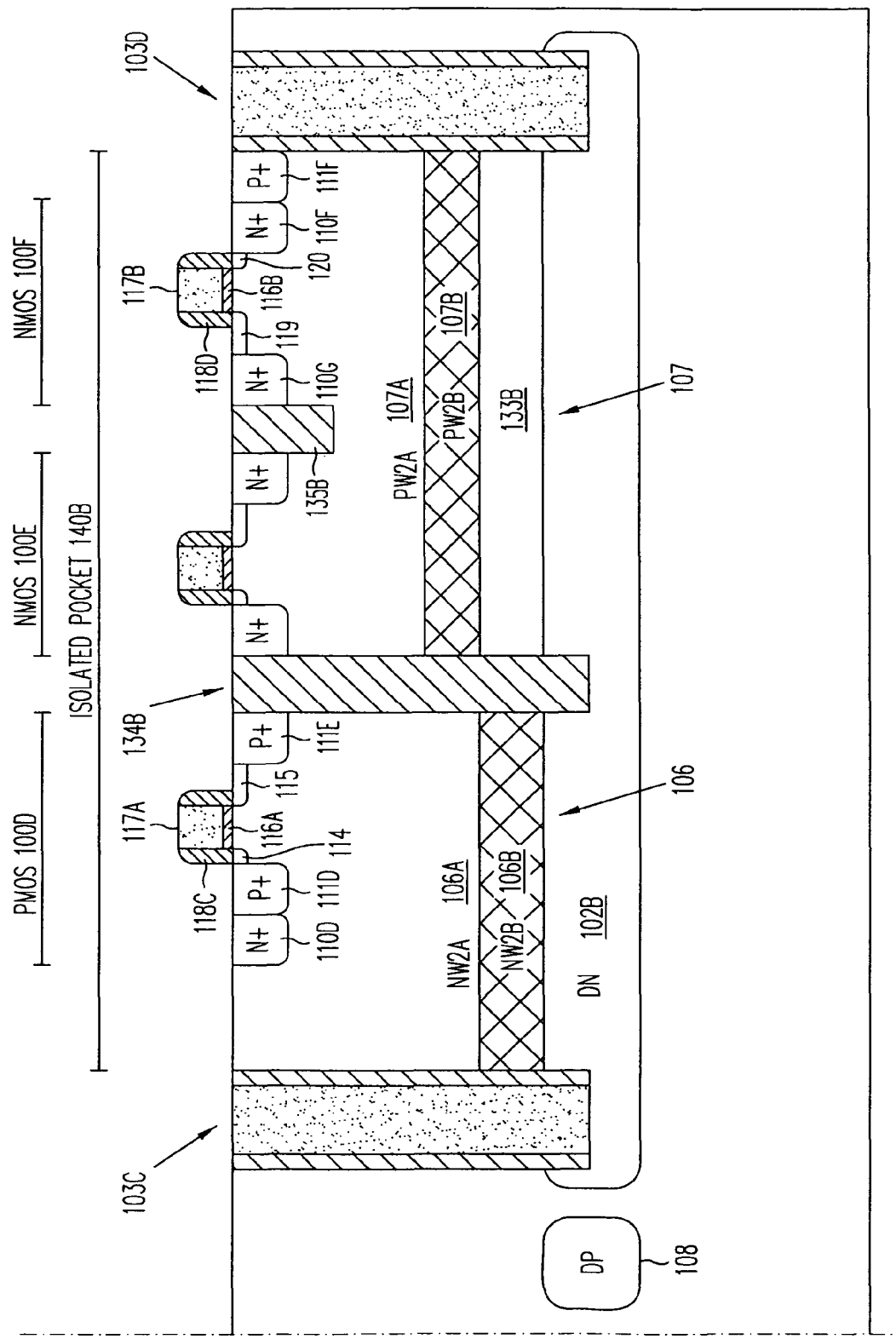

FIG. 1 illustrates a cross-sectional view of isolated CMOS devices fabricated in a common P-type substrate 101. A PMOS 100A, a PMOS 100B, and an NMOS 100C are formed in a pocket 140A, which is isolated from substrate 101 by a deep implanted DN floor isolation region 102A and filled trenches 103A and 103B. The sidewalls of trenches 103A and 103B are covered with a layer 131 of dielectric material and the interior parts of the trenches are filled with a conductive material 132. The conductive material provides contact from the surface to the DN region 102A, and the dielectric material 131 insulates the conductive material 132 from the substrate 101 and from isolated pocket 140A. Trenches 103A and 103B are preferably portions of a single trench that surrounds pocket 140A to provide complete lateral isolation.

Within pocket 140A, a first N-type well 104 is used to form the body region containing the PMOSs 100A and 100B. In a preferred embodiment, the doping profile of the N-well 104 is non-monotonic, comprising at least a top portion 104A and a deeper portion 104B and preferably formed using a phosphorus chain implant of differing energies and doses. The peak doping concentration of deeper portion 104B may be greater than the peak doping concentration of top portion 104A. Since the bottom of N-well 104 overlaps onto DN floor isolation region 102A, there is no intervening P-type layer between N-well 104 and DN floor isolation region 102A.

Also within pocket 140A, a first P-type well 105 is used to form the body of an NMOS 100C. In a preferred embodiment, the doping profile of the P-well 105 is non-monotonic comprising at least a top portion 105A and a deeper portion 105B and preferably formed using a boron chain implant of differing energies and doses. The peak doping concentration of deeper portion 105B may be greater than the peak doping concentration of top portion 105A. Should P-type well 105 not overlap onto DN isolation floor layer 102A, an intervening P-type region 133A will result. Region 133A has a doping concentration substantially the same as the substrate, and it is electrically shorted to the potential of P-type well 105. Since region 133A is generally more lightly doped than the deep P-well portion 105B, it serves to increase the breakdown voltage between P-well 105 and DN floor isolation region 102A. While N-well 104 and P-well 105 may touch, in a preferred embodiment they are separated by a trench 134A, thereby reducing the susceptibility of NMOS 100C and PMOS 100B to latch-up, a type of unwanted parasitic thyristor conduction. Trench 134A may be completely filled with dielectric material, as shown, or it may be filled with dielectric and conductive materials in a manner similar to trenches 103A and 103B.

Within N-well 104, PMOS 100A comprises a P+ source 111A and a P+ drain 111B, a sidewall spacer 118A and an underlying P-type lightly doped drain (PLDD1) 112, a gate 109A located atop a first gate oxide layer 115A, where the first gate oxide layer 115A has a thickness $x_{ox1}$. PMOS 100B is located in the same N-well 104 and is separated from PMOS 100A by refilled trench 135A, which is preferably shallower than trenches 103A, 103B and 134A, although these deeper trenches could also be used for lateral isolation of devices within the same well.

Within P-well 105, NMOS 100C comprises an N+ source 110B and an N+ drain 110A, a sidewall spacer 118B and underlying NLDD1 113, a P+ contact region 111C, and a gate 109B located atop a first gate oxide layer 115B, preferably doped N-type, which also has a thickness $x_{ox1}$. The thickness $x_{ox1}$ of first gate oxide layers 115A and 115B is optimized for the best overall performance and voltage capability for the CMOS devices 100A, 100B, and 100C. Although only one NMOS 100C is shown in P-well 105 for simplicity, in practice many NMOS devices could share the same P-well and would preferably be isolated laterally from each other by refilled trenches.

A second isolated pocket 140B is isolated from substrate 111 by a DN floor isolation region 102B and refilled trenches 103C and 103D. Trenches 103C and 103D are preferably portions of a single trench that laterally surrounds isolated pocket 102B. Within pocket 140B, a second N-type well 106 is used for the body region of a PMOS 100D which preferably has different breakdown voltage or electrical conduction properties than those of PMOSs 100A and 100B. In a preferred embodiment, the doping profile of N-well 106 is non-monotonic, different from the doping profile of first N-well 104. N-well 106 comprises at least a top portion 106A and a deeper portion 106B which are preferably formed using a phosphorus chain implant of differing energies and doses. The peak doping concentration of deeper portion 106B may be greater than the peak doping concentration of top portion 106A. Since the bottom of N-well 106 overlaps onto DN floor isolation region 102B, there is no intervening P-type layer between N-well 106 and DN floor isolation region 102B.

Also within pocket 140B, a second P-type well 107 is used as the body region of NMOSs 100E and 100F, which have different properties from those of NMOS 100C. In a preferred embodiment, the doping profile of the P-well 107 is non-monotonic, comprises at least a top portion 107A and a deeper portion 107B, and is preferably formed using a boron chain implant of differing energies and doses. The peak doping concentration of deeper portion 107B may be greater than the peak doping concentration of top portion 107A. Should P-type well 107 not overlap onto DN floor isolation region 102B, an intervening P-type layer 133B will result.

Within P-type well 107, NMOS 100F comprises an N+ source 110F and an N+ drain 110G, a P+ contact region 111F providing contact to the body region P-well 107, a sidewall spacer 118D, a lightly-doped drain extension (NLDD2) 119, a source extension (NLDS2) 120, and a gate 117B located atop second gate oxide layer 116B.

NMOS 100E is located in the same P-well 107 and is separated from NMOS 100F by refilled trench 135B, which is preferably shallower than trenches 103C and 103D and 134B, although these deeper trenches could also be used for lateral isolation of devices within the same well. While N-type well 106 and P-type well 107 may touch, in a preferred embodiment trench 134B separates them, thereby reducing their susceptibility to latch-up.

Within N-well 106, a PMOS 100D comprises a P+ source 111D and a P+ drain 111E, a sidewall spacer 118C, a lightly-doped drain extension (PLDD2) 115 and a source extension (PLDS2) 114, a gate 109C located atop a second gate oxide layer 116A, where the second gate oxide 116A has a thickness $x_{ox2}$ different than the first gate oxide 115A.

In a preferred embodiment, the CMOS devices in pocket 140B are higher voltage devices than the CMOS devices in pocket 140A, the second gate oxide layers 116A and 116B are thicker than the first gate oxide layers 115A and 115B, i.e. $x_{ox2} > x_{ox1}$, and the second P-well 107 and second N-well 106 have lower surface concentrations and greater depths than the first P-well 105 and first N-well 104. The gates 109A and 109B may be the same or different than gates 117A and 117B, and they can have the same doping for both NMOS and PMOS transistors, or preferably the gates 109A and 117A of PMOSs 100A and 100D may comprise P-type polysilicon while the gates 109B and 117B NMOSs 100C and 100F use N-type polysilicon. Some or all of the gates 109A, 109B, 117A and 117B may also comprise a silicide. In the lower voltage CMOS of pocket 140A, sidewall spacers 118A and 118B determine the length of LDD drift regions 112 and 113, and P+ drain region 111B and N+ drain region 110A abut trenches 135A and 134A, respectively. In the higher voltage CMOS of pocket 140B, by contrast, the extent of LDD drift regions 115 and 119 are determined by mask alignment and not by the width of sidewall spacer 118C and 118D. N+ drain region 110G and P+ drain region 111E may also be separated from trenches 135B and 134B by lightly doped regions that are the same as, or different from, the LDD regions.

As an artifact of the sidewall spacer process, the width of sidewall spacers 118C and 118D determines the length of source extensions 114 and 120. These source extensions may be formed simultaneously with the LDD1 or LDD2 regions, or they may be independently optimized.

Any number of CMOS devices can be integrated by introducing trenches similar to trenches 103A-103D between and amongst them, either atop a shared floor isolation region, or in an isolated region with its own dedicated floor isolation region electrically biased to a different potential. By including additional well implants and gate oxides, any number of fully isolated CMOS devices can be integrated and optimized for operation at different voltages and device densities.

An optional Deep P-type (DP) region 108 may be interposed between adjacent isolated pockets 104A and 104B in order to reduce the susceptibility to punch-through breakdown and/or leakage between the pockets.

Figure 2A:
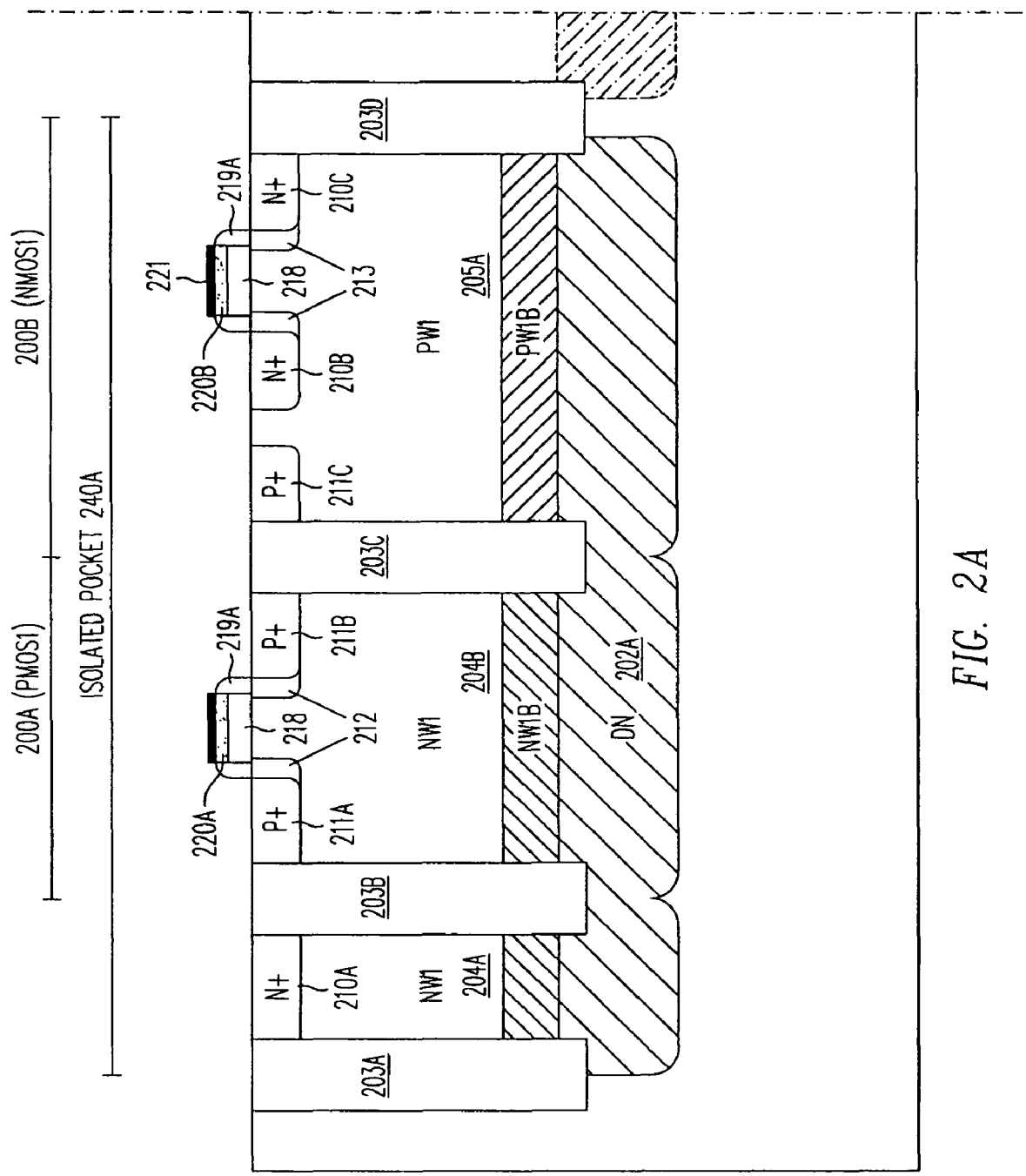
FIG. 2 illustrates a cross-sectional view of CMOS devices fabricated according to a second embodiment of the present invention.
Figure 2B:
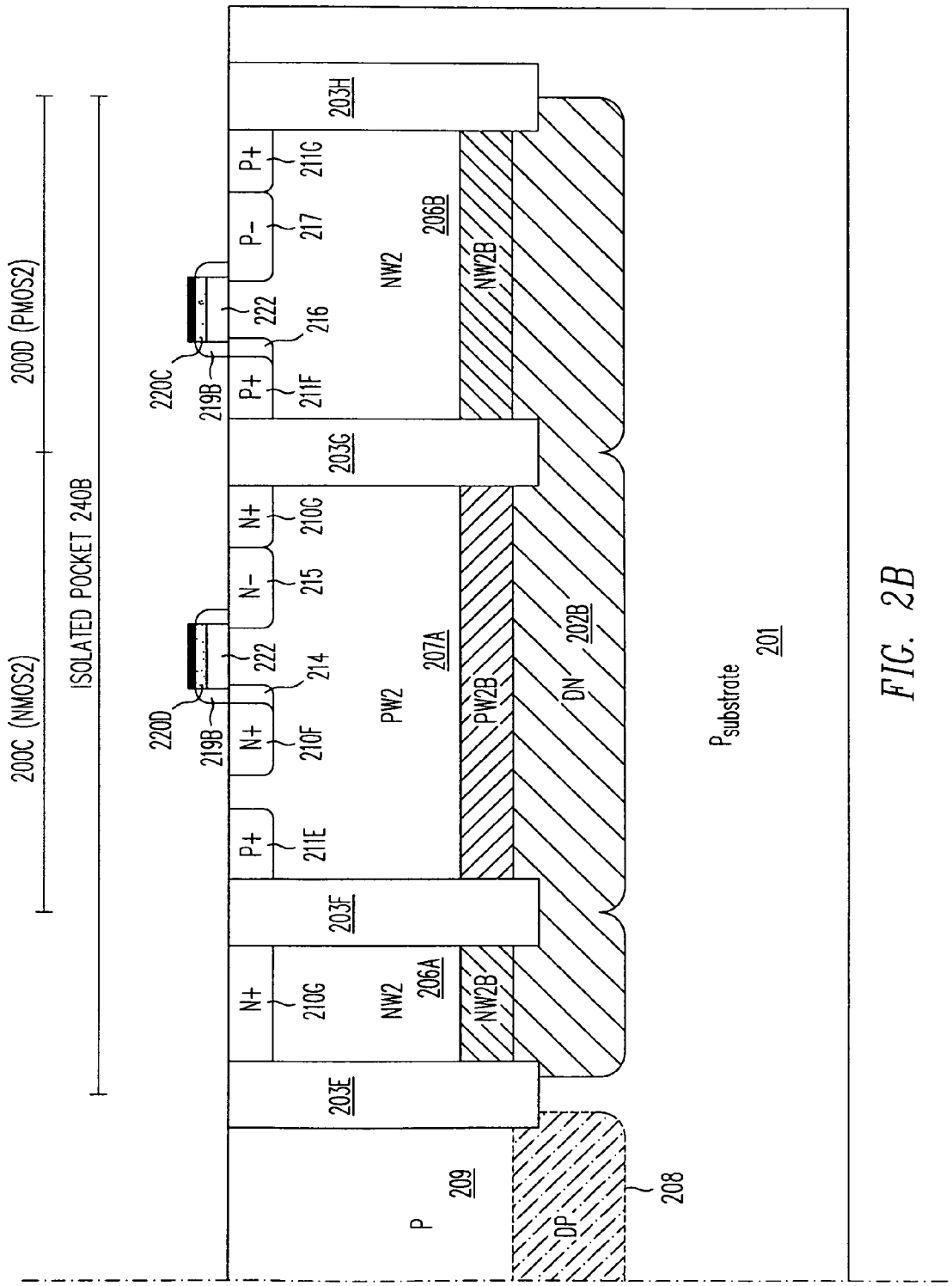

FIG. 2 illustrates an alternative embodiment of isolated CMOS devices, which use dielectrically-filled trenches rather than trenches having the conductive refill material shown in FIG. 1. In FIG. 2, a PMOS 200A and an NMOS 200B are formed in an isolated pocket 240A, which is isolated from P-type substrate 201 by a DN floor isolation 202A and trenches 203A and 203D. Trenches 203A and 203D are preferably portions of a single trench that laterally surrounds isolated pocket 240A. Within isolated pocket 240A, a first N-type well 204B is used to form the body of PMOS 200A. an N-type well 204A overlaps and is used to contact the DN floor isolation region 202A. In a preferred embodiment, the doping profile of N-type wells 204A and 204B is non-monotonic, comprising at least a top portion NW1 and a deeper portion NW1B and preferably formed using a phosphorus chain implant of differing energies and doses. The peak doping concentration of deeper portion NW1B may be greater than the peak doping concentration of top portion NW1. Since the bottom of N-type well 204B overlaps onto DN region 202A, no intervening P-type layer is present.

Also within isolated pocket 240A, a first P-type well 205A is used to form the body of NMOS 200B. In a preferred embodiment, the doping profile of P-type well 205A is non-monotonic comprising at least a top portion PW1 and a deeper portion PW1B and preferably formed using a boron chain implant of differing energies and doses. The peak doping concentration of deeper portion PW1B may be greater than the peak doping concentration of top portion PW1. Should P-type well 205A not overlap onto DN layer 202A, an intervening P-type layer (not shown) will result. Since this layer is also P-type it is electrically shorted to P-type well 205A. N-type well 204B and P-type well 205A may touch each other. However, in a preferred embodiment, a trench 203C separates them, thereby reducing their susceptibility to latch-up, a type of unwanted parasitic thyristor conduction. As shown, trenches 203A and 203B surround N-type well 204A preventing lateral conduction between N-type wells 204A and 204B, and further suppressing latch-up.

Within N-type well 204B, the PMOS 200A comprises a P+ source 211A and a P+ drain 211B, a sidewall spacer 219A and an underlying LDD 212, a polysilicon gate 220A with optional silicide 221, where the gate 220A is located atop a first gate oxide layer 218, and where the first gate oxide layer has a thickness $x_{ox1}$. Within P-type well 205A, the NMOS 200B comprises an N+ source 210B and an N+ drain 210C, a sidewall spacer 219A and an underlying LDD 213, a polysilicon gate 220B with optional silicide 221, where the silicided gate 220B is also located atop first gate oxide layer 218, where first gate oxide layer 218 has a thickness $x_{ox1}$, optimized for the best overall performance and voltage capability for both PMOS 200A and NMOS 200B. Polysilicon gates 220A and 220B may both be doped N-type or alternatively PMOS polysilicon gate 220A may be doped P-type and NMOS polysilicon gate 220B doped N-type.

The DN floor isolation region 202A is contacted using N-type well 204A and N+ contact region 210A, both of which are surrounded by dielectrically filled trenches 203A and 203B.

A second CMOS pair is formed in a second isolated pocket 240B, isolated from substrate 201 by a DN floor isolation region 202B and trenches 203E and 203H. Trenches 203E and 203H are preferably portions of a single trench that laterally surrounds isolated pocket 240B. Within pocket 240B, a second N-type well 206B forms the body region of a PMOS 200D, which preferably has different a breakdown voltage or electrical conduction properties than PMOS 200A. A second N-type well 206A is also used to contact DN floor isolation region 202B. As shown, trenches 203E and 203F surround N-type well 206A. In a preferred embodiment, the doping profile of N-type well 206B is non-monotonic and different from the doping profile of first N-type well 204B, and comprises at least a top portion NW2 and a deeper portion NW2B, and is preferably formed using a phosphorus chain implant of differing energies and doses. The peak doping concentration of deeper portion NW2B may be greater than the peak doping concentration of top portion NW2. Since the bottom of N-type well 206B overlaps onto DN floor isolation region 202B, no intervening P-type layer is present in the device.

Also within pocket 240B, a second P-type well 207A is used to form an NMOS 200C, which has different electrical properties than NMOS 200B. In a preferred embodiment, the doping profile of second P-type well 207A is non-monotonic, comprises at least a top portion PW2 and a deeper portion PW2B, and is preferably formed using a boron chain implant of differing energies and doses. The peak doping concentration of deeper portion PW2B may be greater than the peak doping concentration of top portion PW2. Should P-type well 207A not overlap onto DN floor isolation region 202B, an intervening P-type layer (not shown) will result. Since this layer is also P-type it is electrically shorted to the potential of P-type well 207A.

While N-type well 206B and P-type well 207A may touch, in a preferred embodiment, a trench 203G separates them, thereby reducing their susceptibility to latch-up.

Within N-type well 206B, PMOS 200D comprises a P+ source 211F and a P+ drain 211G, a sidewall spacer 219B, an LDD 217 and an LDS 216, a polysilicon gate 220C with optional silicide 221, where the silicided gate is located atop a second gate oxide layer 222, and where the second gate oxide layer 222 has a thickness $x_{ox2}$ different than $x_{ox1}$ of first gate oxide layer 218. Within P-type well 207A, NMOS 200C comprises an N+ source 210F and an N+ drain 210G, a sidewall spacer 219B, an LDD 215 and an LDS 214, a polysilicon gate 220D with optional silicide 221, where the gate 220D is also located atop second gate oxide layer 222. Second gate oxide layer 222 has a thickness $x_{ox2}$, optimized for the best overall performance and voltage capability for both PMOS 200D and NMOS 200C.

In a preferred embodiment NMOS 200C and PMOS 200D are higher voltage devices than NMOS 200B and PMOS 200A, the second gate oxide layer 222 is thicker than the first gate oxide layer 218, and the second P-type well 207A and the second N-type well 206B have a lower surface concentration and greater depth than first P-type well 205A and first N-type well 204B, respectively. The polysilicon material used to form gates 220A, 220B, 220C, and 220D may comprise the same layer with N-type doping for both the NMOS transistors 200B and 200C and the PMOS transistors 200A and 200D, or the gate oxide layer in one or both of the PMOS transistors 200A and 200D may comprise P-type doped polysilicon. It is also possible to use different polysilicon layers to form the gate of one or more of the transistors 200A-200D.

In a preferred embodiment, the lengths of the lightly-doped drains 215 and 217 of NMOS 200C and PMOS 200D, respectively, are determined by photolithography.

As an artifact of the sidewall spacer process, the width of sidewall spacer 219A determines the length of lightly doped source extensions 212 and 213, of PMOS 200A and NMOS 200B, respectively, while sidewall spacer 219B determines the length of lightly doped source extensions 214 and 216, of NMOS 200C and PMOS 200D, respectively. Sidewall spacers 219A and 219B may be formed simultaneously, or may be formed independently. Alternatively, sidewall spacer 219B may be eliminated without adversely impacting the drain breakdown of the devices.

Any number of CMOS devices can be integrated by introducing trenches similar to trenches 203A, 203D, 203E and 203H between and amongst them, either atop a shared floor isolation region, or in an isolated region with its own dedicated floor isolation region electrically biased to a different potential. By including additional well implants and gate oxides, any number of fully isolated CMOS devices can be integrated and optimized for operation at different voltages and device densities.

An optional deep P-type (DP) region 208 may be interposed between adjacent isolated pockets 204A and 240B in order to reduce the susceptibility to punch-through breakdown and/or leakage between the pockets.

Figure 3:
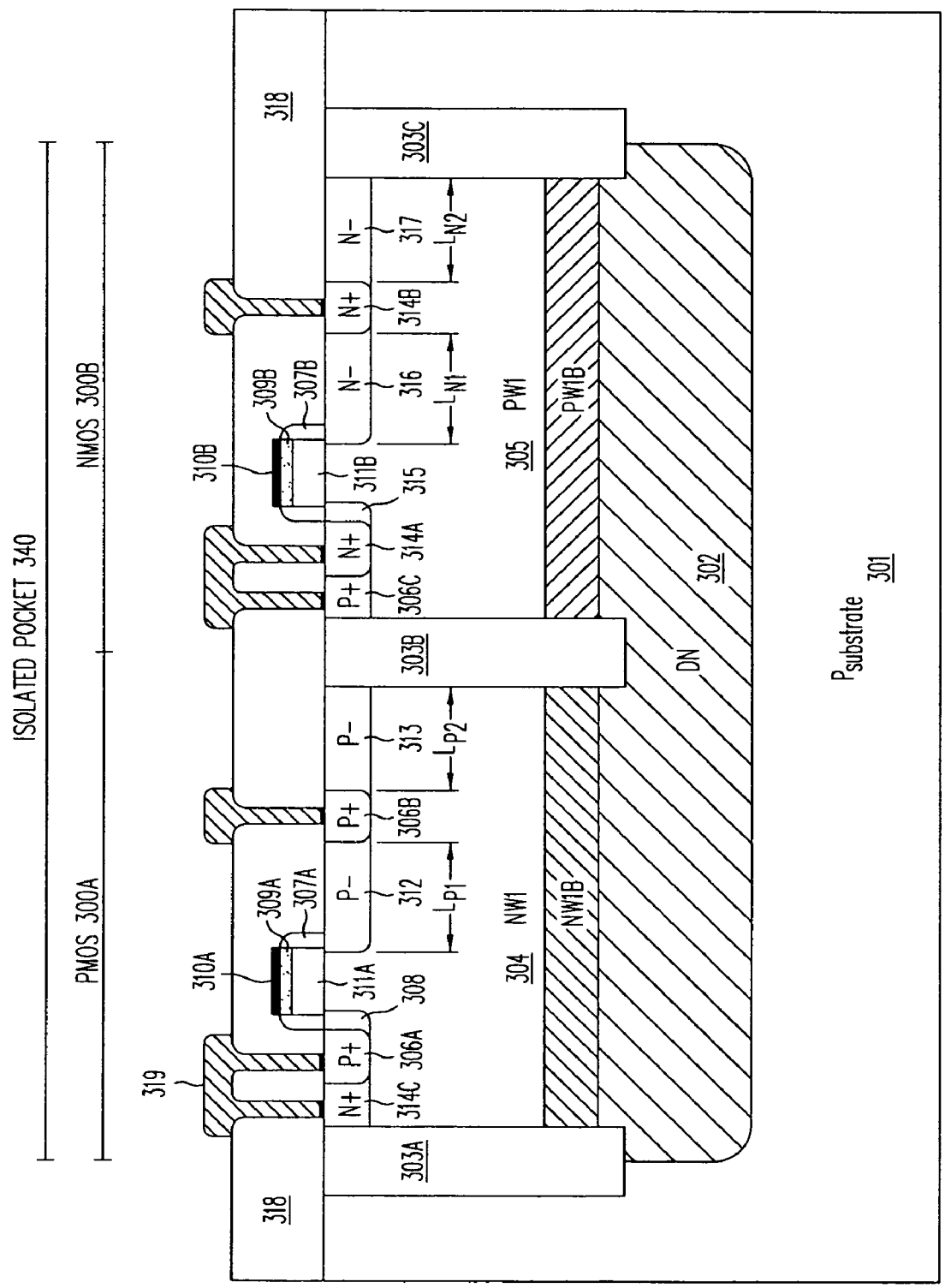
FIG. 3 illustrates a cross-sectional view of CMOS devices fabricated according to a third embodiment of the present invention.

FIG. 3 illustrates an alternative embodiment of isolated CMOS devices, in which the heavily-doped drain regions do not abut the trenches. This embodiment consumes more surface area than those described above, but may be advantageous in preventing device leakage. An isolated pocket 340 is isolated from P-type substrate 301 by a DN floor isolation region 302 and trenches 303A and 303C. Trenches 303A and 303C are preferably portions of a single trench that laterally surrounds isolated pocket 340. Within pocket 340, an N-type well 304 forms the body region of a PMOS 300A and also provides contact to DN floor isolation region 302. In a preferred embodiment, the doping profile of N-type well 304 is non-monotonic comprising at least a top portion NW1 and a deeper portion NW1B and is preferably formed using a phosphorus chain implant of differing energies and doses. The peak doping concentration of deeper portion NW1B may be greater than the peak doping concentration of top portion NW1. Since the bottom of N-type well 304 overlaps onto DN floor isolation region 302, no intervening P-type layer is present.

Also within pocket 340, a P-type well 305 forms the body region of an NMOS 300B. In a preferred embodiment, the doping profile of P-type well 305 is non-monotonic comprising at least a top portion PW1 and a deeper portion PW1B and is preferably formed using a boron chain implant of differing energies and doses. The peak doping concentration of deeper portion PW1B may be greater than the peak doping concentration of top portion PW1. Should P-type well 305 not overlap onto DN floor isolation region 302, an intervening P-type layer (not shown) will result. Since this layer is also P-type it is electrically shorted to the potential of P-type well 305. While N-type well 304 and P-type well 305 may touch, in a preferred embodiment a trench 303B separates them, thereby reducing their susceptibility to latch-up.

Within N-type well 304, the PMOS 300A comprises a P+ source 306A and a P+ drain 306B, a sidewall spacer 307A and an LDS 308, a gate 309A with optional silicide 310A, where the gate 309A is located atop a gate oxide layer 311A. P+ drain 306B is surrounded by P− LDD extensions comprising LDD 312 of length $L_{P1}$ interposed between the P+ drain 306B and gate 309, and LDD 313 of length $L_{P2}$ interposed between the P+ drain 306B and trench 303B. In such a design, the P+ drain 306B does not abut the trench 303B. An N+ contact region 314C provides contact to N-type well 304.

Within P-type well 305, NMOS 300B comprises an N+ source 314A and an N+ drain 314B, a sidewall spacer 307B and an LDS 315, a gate 309B with optional silicide 310B, where the gate 309B is located atop a gate oxide layer 311B. N+ drain 314B is surrounded by N− LDD extensions comprising LDD 316 of length $L_{N1}$ interposed between the N+ drain 314B and gate 309B and LDD 317 of length $L_{N2}$ interposed between the N+ drain 314B and trench 303C. In such a design, the N+ drain 314B does not abut the trench 303C. A P+ contact region 306C provides contact to P-type well 305. Contact to NMOS 300B and PMOS 300A is achieved by a patterned metallization layer 319 extending into holes etched into an interlevel dielectric layer 318.

Figure 4:
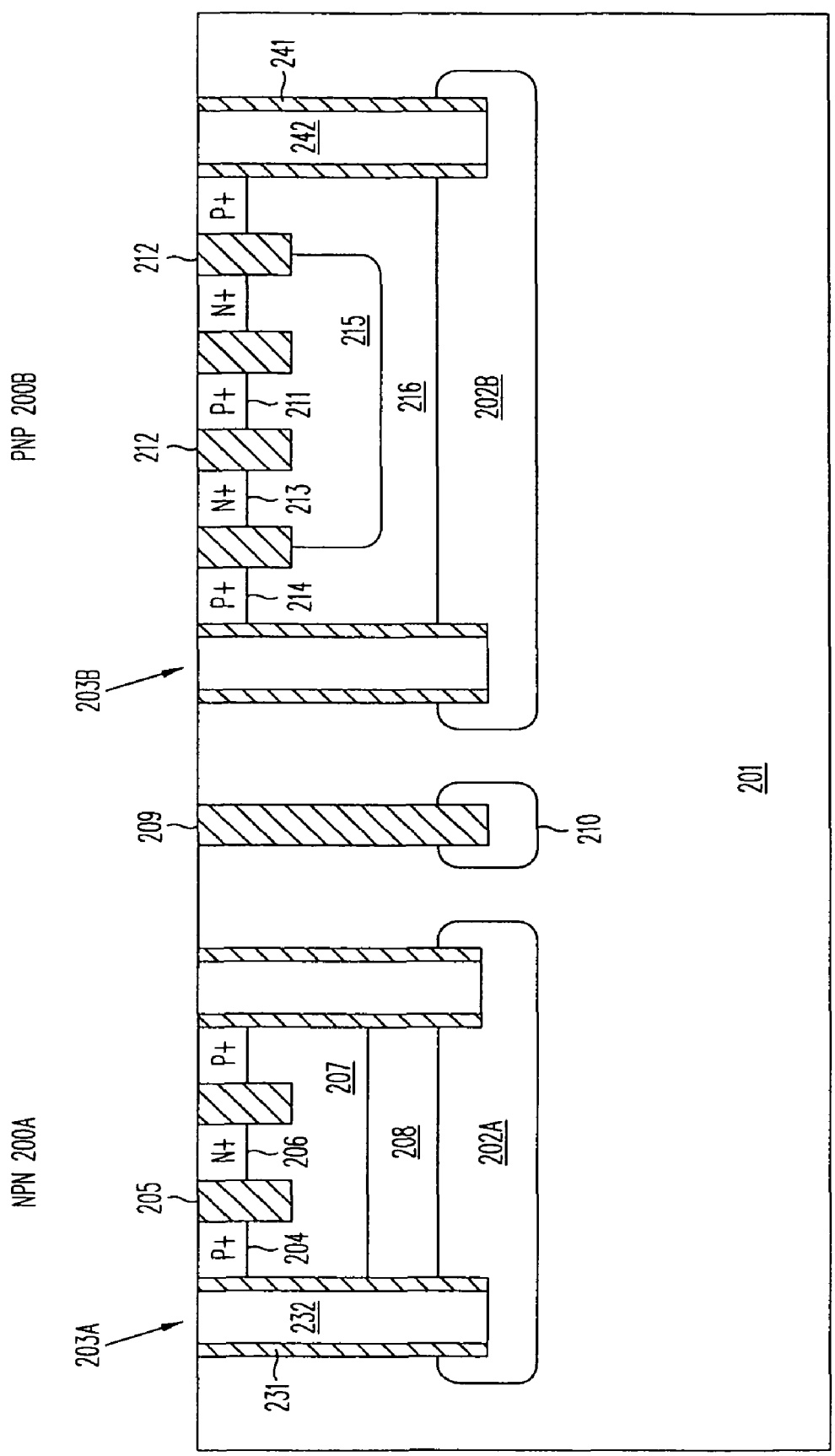
FIG. 4 is a cross-sectional view of isolated bipolar transistors wherein the trenches contain a conductive material in contact with the floor isolation regions.

FIG. 4 illustrates a cross-sectional view of isolated bipolar devices fabricated in a common P-type substrate 201. For simplicity, interlevel dielectric layers and metalization layers are not shown in FIG. 4.

NPN transistor 200A is isolated from substrate 201 by deep N-type (DN) floor isolation region 202A and filled trench 203A. The sidewalls of trench 203A are covered with a layer of dielectric material 231 and the interior part of the trench is filled with a conductive material 232. The conductive material provides contact from the surface to the floor isolation region 202A, which also serves as the collector of NPN 200A, and the dielectric material 231 insulates the conductive material 232 from the substrate 201. Trench 203A preferably laterally surrounds NPN 200A to provide complete lateral isolation.

N+ emitter 206 may be formed by conventional implantation and diffusion, or it may be diffused from a polysilicon source to form a "poly emitter." P-type base region 207 is disposed beneath N+ emitter 206 and preferably has a doping profile that is dedicated to and optimized for the performance of NPN 200A. In other embodiments, however, base region 207 may comprise the same P-well region that is used for other integrated devices, such as the P-body region of an NMOS transistor. P+ base contact region 204 provides contact to base region 207 from the surface of substrate 201.

The intervening region 208 disposed below base region 207 and above DN floor isolation region (collector) 202A may be an isolated pocket of substrate 201 with substantially the same doping concentration. In another embodiment, base region 207 may extend further downward to contact floor isolation region (collector) 202A, with no intervening region 208. In yet another embodiment, an extra implantation may be performed to provide an upward extension of DN floor isolation region (collector) 202A in this area. In this preferred embodiment N-type region 208 and DN floor isolation region 202A together comprise a non-monotonic doping profile in which an upper portion (N-type region 208) has a lower doping concentration than a deeper portion floor isolation region 202A. The lower doping in the upper portion reduces depletion spreading in base 207, thereby increasing the Early voltage of NPN 200A, while the higher doping of the deep portion reduces the collector resistance and improves the saturation characteristics of NPN 200A.

Shallow trenches 205 are preferably used to isolate N+ emitter 206 from P+ base contacts 204. Trenches 205 are preferably 0.2-0.5 um wide, 0.2-0.6 um deep, and filled completely with a dielectric material. Trench 203A is preferably wider and deeper than trenches 205, e.g. in the range of 0.5-1.5 um wide and 1.5-3 um deep.

PNP transistor 200B is isolated from substrate 201 by DN floor isolation region 202B and filled trench 203B. The sidewalls of trench 203B are covered with a layer of dielectric material 241 and the interior part of the trench is filled with a conductive material 242. The conductive material 242 provides contact from the surface to the floor isolation region 202B. Trench 203B and DN floor isolation region 202B surround PNP 200B and electrically isolate PNP 200B from substrate 201.

P+ emitter 211 may be formed by conventional implantation and diffusion, or it may be diffused from a polysilicon source to form a "poly emitter." N-type base region 215 is disposed beneath P+ emitter 211 and preferably has a doping profile that is dedicated to and optimized for the performance of PNP 200B. In other embodiments, however, base region 215 may comprise the same N-well region that is used for other integrated devices, such as the N-body region of a PMOS transistor. N+ base contact regions 213 provide contact to base region 215 from the surface of substrate 201.

P-type collector region 216 is disposed beneath base region 215 and in one embodiment comprises a heavily-doped region (e.g. with a sheet resistance in the range of 500-2000 ohms/square) formed by high-energy implantation. P-type collector region 216 may advantageously be used elsewhere in the integrated circuit, e.g. to locally increase the doping of P-type substrate 201 in order to reduce susceptibility to latch-up. P+ collector contact regions 214 provide contact to P-type collector region 216 from the surface of substrate 201.

In another embodiment P-type collector region 216 has a non-monotonic doping profile in which an upper portion has a lower doping concentration than a deeper portion. The lower doping in the upper portion reduces depletion spreading in base 215 thereby increasing the Early voltage of PNP 200B, while the higher doping of the deep portion reduces the collector resistance and improves the saturation characteristics of PNP 200B. In a preferred embodiment, the doping profile of the collector 216 is formed using a boron chain implant of differing energies and doses.

Shallow trenches 212 are preferably used to isolate P+ emitter 211, N+ base contact regions 213, and P+ collector contact regions 214 from each other. These trenches are preferably filled with a dielectric material, while trenches 203B preferably comprise a conductive material 242 that provides electrical contact to DN floor isolation region 202B. Separating the heavily-doped base, collector, and emitter regions with dielectric filled trenches allows reduction of the device size, reduction of capacitance, and improvement of switching performance.

An additional filled trench 209 may be interposed laterally between NPN 200A and PNP 200B to avoid punchthrough and other parasitic interactions between these devices, allowing them to be placed closer together in common substrate 201. Filled trench 209 may be filled with a dielectric material, as shown in this example, or it also comprise a conductive material as shown in trenches 203A and 203B. A submerged isolation region 210 may also be included adjacent the bottom of trench 209. In one embodiment, region 210 may be P-type to locally increase the doping of substrate 201. In another embodiment, region 210 may be N-type (in one example, formed at the same time as DN floor isolation regions 202A and 202B) to serve as a dummy collector of electrons that may be present in the substrate.

Figure 5:
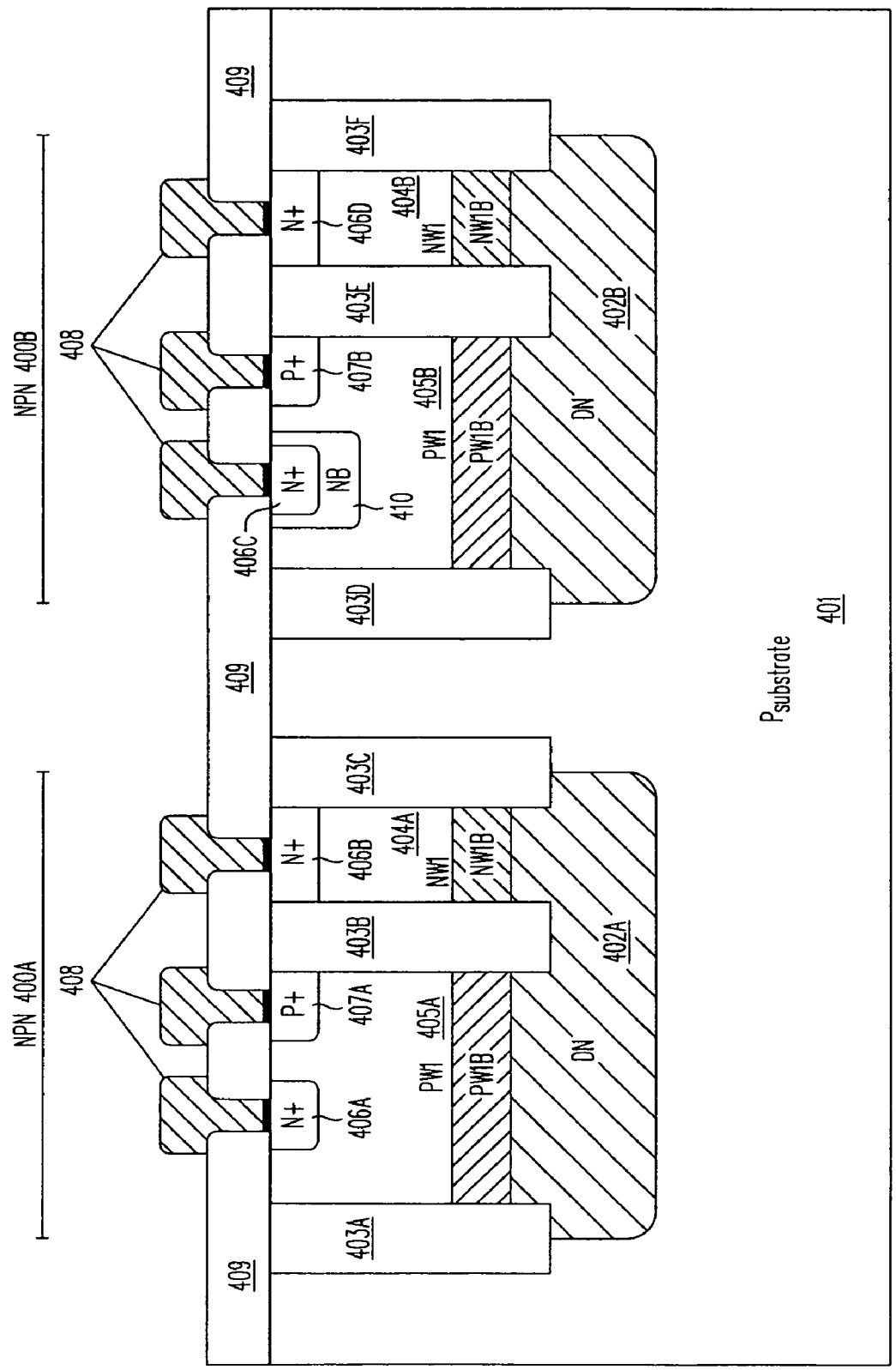
FIG. 5 is a cross-sectional view of isolated bipolar transistors wherein the trenches are filled with a dielectric material.

FIG. 5 illustrates two NPN bipolar transistors 400A and 400B, fabricated in isolated pockets that are isolated from each other and from P-type substrate 401 by DN floor isolation regions 402A and 402B along with filled trenches 403A, 403C, 403D and 403F. Unlike the devices of FIG. 4, the filled trenches 403A, 403C, 403D and 403F in FIG. 5 are completely filled with dielectric material. Therefore, contact to the DN floor isolation regions 402A and 402B is provided through additional N-well regions 404A and 404B.

In a preferred embodiment, NPN 400A and NPN 400B use CMOS P-type well regions as base regions 405A and 405B. NPN 400A uses an implanted N+ emitter 406A while NPN 400B has an emitter region comprising a combination of the N+ region 406C and NB region 410, which has a deeper junction than the N+ region 406C. In other embodiments, base regions 405A and/or 405B may comprise dedicated regions that are optimized for the performance of NPN 400A and/or NPN 400B In NPN 400A, DN floor isolation region 402A forms the collector region, contacted from the surface through N-type well 404A and N+ region 406B. P-type well of P-type well 405A is non-monotonic comprising at least a top portion PW1 and a deeper portion PW1B and preferably formed using a boron chain implant of differing energies and doses. The deeper portion PW1B of P-type well 405A may have a higher concentration than the top portion PW1. Surface contact to the base region 405A is achieved through P+ region 407A. The emitter of NPN 400A comprises N+ region 406A. N-type well 404A may be separated from P-type well 405A by filled trench 403B. Contact is achieved through metal 408 with an optional barrier metal touching the P+ region 407A and N+ regions 406A and 406B through contact windows formed in interlevel dielectric layer 409.

In NPN 400B, DN floor isolation region 402B forms the collector region, contacted from the surface through N-type well 404B and N+ region 406D. P-type well 405B forms the base region of NPN 400A. Surface contact to the base region 405B is achieved through P+ region 407B. The emitter of NPN 400A comprises N+ region 406C and underlying NB region 410. NB region 410 is designed to improve the performance of the NPN 400B over that which is possible using the elements that are shared with the CMOS devices (e.g., N+ region 406C and P-type well 405B). For example, the depth and doping of NB region 410 can provide a better combination of current gain, breakdown voltage, and Early voltage.

N-type well 404B may be separated from P-type well 405B by trench 403E. Contact is achieved through metal 408 with an optional barrier metal touching the P+ region 407B and N+ regions 406C and 406D through contact windows formed in interlevel dielectric layer 409. A submerged isolation region (not shown) may be present between DN floor isolation region 402A and DN floor isolation region 402B to suppress punch-through.

As described above, isolated bipolar transistors of the present invention may be optimized for cost, by sharing the formation of bipolar transistor regions with regions used elsewhere in the integrated circuit. Alternatively, performance can be increased, for example, by adding dedicated base implants that are customized to achieve the best overall tradeoff between Early voltage $V_A$, current gain $\beta$, breakdown voltage $BV_{CEO}$, and frequency capability $f_t$ and $f_{max}$. Likewise, common implanted regions may be used to form the emitter regions of the bipolar transistors, or dedicated emitters may be formed using techniques such as polysilicon emitter formation. The transit time $\tau_e$ of minority carriers in the emitter, like those crossing the base, imposes certain restrictions on the upper operating frequency capability of a device, typically below 10 GHz. This emitter transit time limitation can be improved by using a polysilicon emitter in place of a diffused or implanted emitter, and by adjusting the depth of the base accordingly. Silicon bipolar transistors operating between 10 to 20 GHz are possible using such techniques without the need for SiGe heterojunctions and the manufacturing complexities associated with such devices.

In the present invention, the aforementioned problems with LOCOS isolation are obviated by using a manufacturing process that combines shallow, medium, and/or deep trench isolation (STI, MTI, DTI) with floor isolation regions formed by high-energy implantation. The novel combination of STI for sidewall isolation and high energy implanted floor isolation represent both a method and apparatus for integrating and isolating devices at high densities, without the need for long high-temperature diffusion or expensive epitaxial deposition.

Application Ser. No. 11/444,102, filed May 31, 2006, incorporated herein by reference, describes several related isolation structures. application Ser. No. 12/002,358, filed Dec. 17, 2007, incorporated herein by reference, describes methods and devices incorporating a different, but related, isolation structure.

Figure 6A:
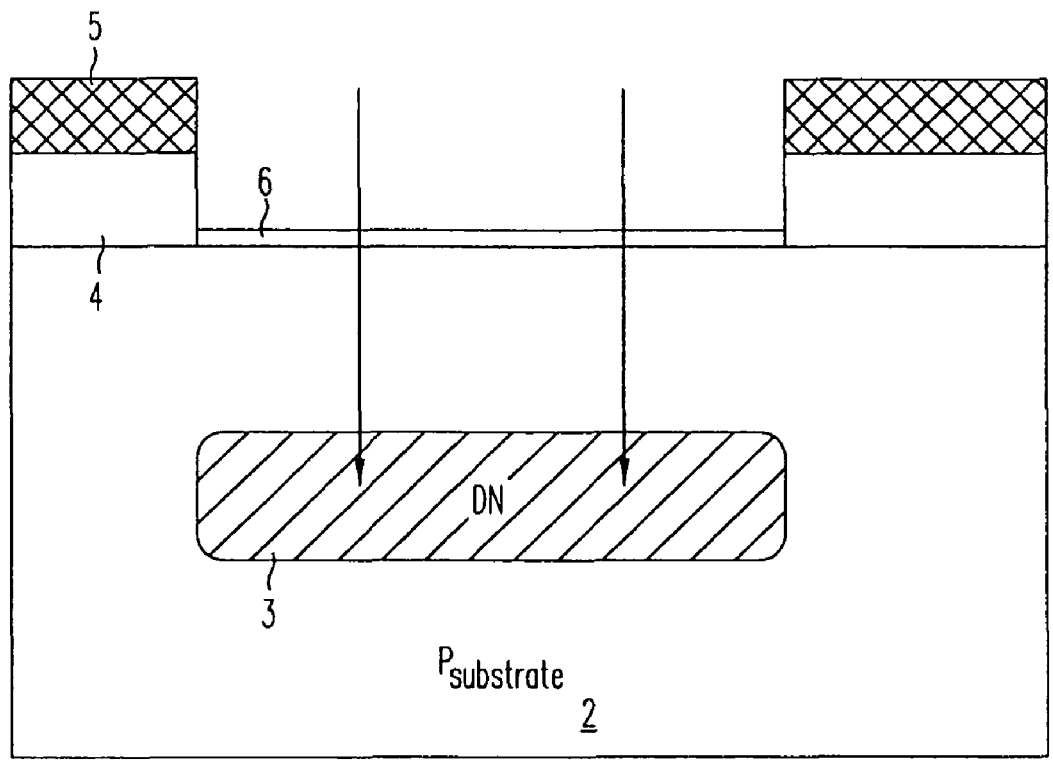
FIGS. 6A-6D illustrate a process flow for forming a non-self-aligned isolation structure wherein the floor isolation region is implanted prior to the formation of the trench.

Cross section 1 of FIGS. 6A-6D illustrate one possible fabrication sequence for forming the isolation structure in accordance with this invention. In FIG. 6A, deep N-type (DN) floor isolation region 3 is introduced into lightly-doped P-type substrate 2 using high-energy ion implantation through an opening in hard mask 4 with optional photoresist mask 5. The implant may be performed through a thin pre-implant oxide 6. In a preferred embodiment, DN region 3 is formed by implanting phosphorus at high energy without any significant high temperature processing after implantation. Such deep N-type regions are referred to as "DN", an acronym for deep N-type region. Since no epitaxial layer is grown on top of P-type substrate 2, DN region 3 is not the same as a buried layer formed using high temperature processing in conventional epitaxial processes, despite the similar appearance of the two structures.

The peak concentration and total vertical width of a conventional buried layer is affected by substantial diffusion that occurs in high temperature fabrication before, during, and after epitaxial growth. The problem of variability in diffused and epitaxial processes occurs because slight changes in temperature can cause large deviations in dopant profiles, a consequence of the exponential dependence of diffusivity on temperature.

In the low-temperature process of this invention, the doping profiles of implanted DN regions are affected only by the implant dose and energy (or doses and energies in the case of multiple implants). The resulting profile is "as-implanted", and is not subject to the variability inherently associated with thermal processing. In a preferred embodiment, DN region formation may comprise the highest energy implantation in the process, in the range of 1 MeV (one million-electron-volts) to over 3 MeV. Such implants may be achieved in reasonable times using singly- and doubly-ionized dopant species. Triply-ionized dopant species having a high charge state can be implanted to a greater depth, but at correspondingly lower beam currents. Phosphorus implant doses for the DN region may range from $1E12$ $cm^{-2}$ to $1E14$ $cm^{-2}$ but typically comprise doses in the $5E12$ $cm^{-2}$ to $5E13$ $cm^{-2}$ range.

Figure 6B:
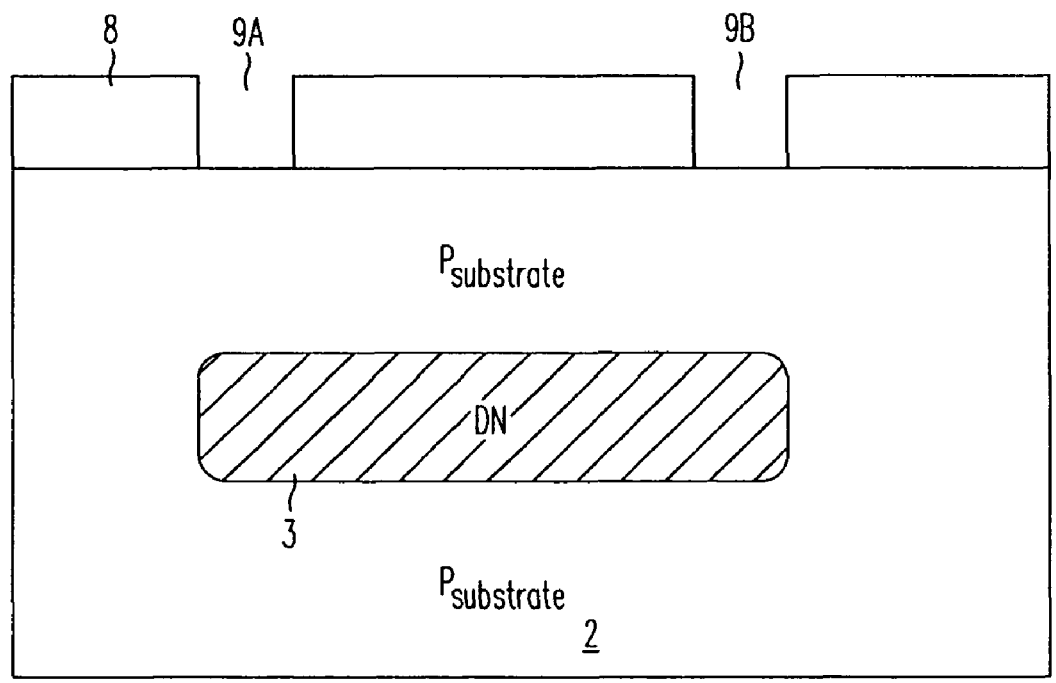
Figure 6C:
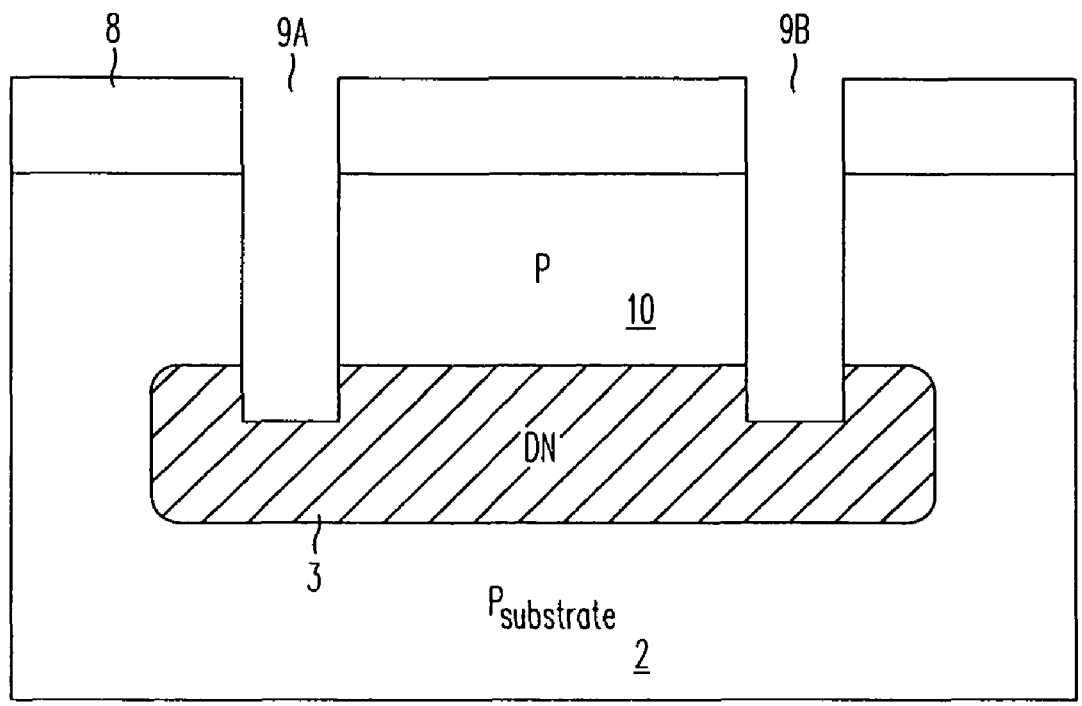

FIG. 6B shows the isolation structure after deposition of masking layer 8, preferably at a low temperature to prevent dopant redistribution in DN region 3. Layer 8 may comprise, for example, a deposited oxide. Layer 8 is subsequently masked to form openings 9A and 9B. In FIG. 6C, trenches are etched in substrate 2 through openings 9A and 9B to a depth vertically overlapping DN region 3. The trenches are subsequently filled with a dielectric and planarized to form electrically insulating trenches 11A and 11B, shown in FIG. 6D. The result is the formation of electrically isolated P-type pocket 10, which is electrically isolated from P-type substrate 2 by a combination of junction isolation at the bottom and dielectric filled trenches along the sidewalls.

While two trenches are shown, trenches 11A and 11B may in reality comprise a single trench laterally surrounding isolated pocket 10, and any number of trenches may be introduced, to form multiple isolated P-regions all sharing common DN region 3. Alternatively, multiple DN regions may also be introduced, facilitating the integration of multiple isolation regions which may be biased at different voltages or used to electrically integrate, float, or decouple the electrical noise for varying types of circuitry.

Figure 6D:
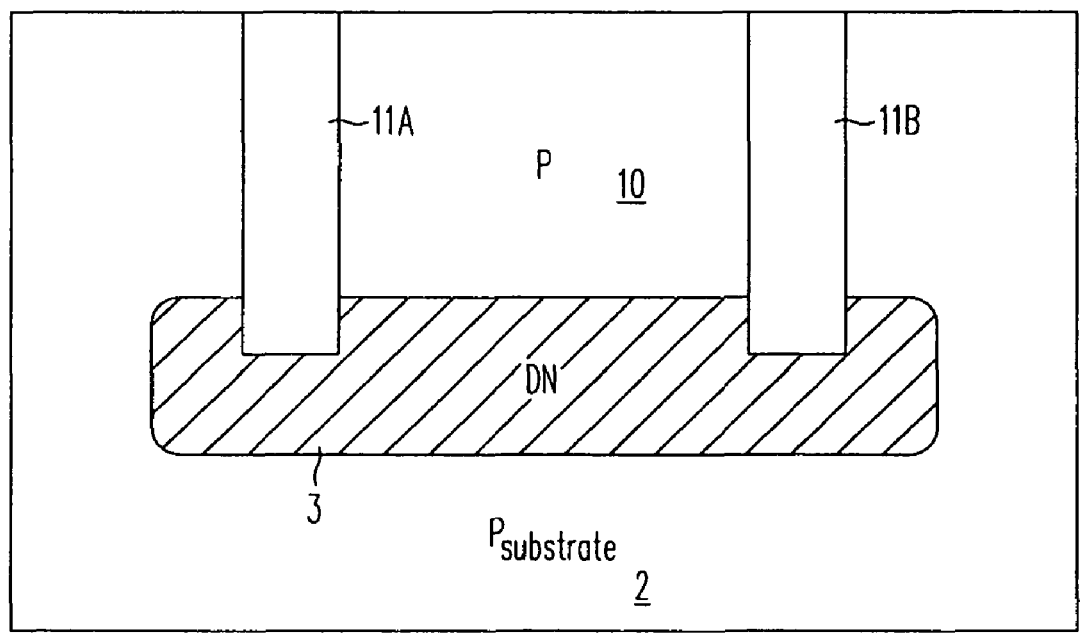
Figure 7A:
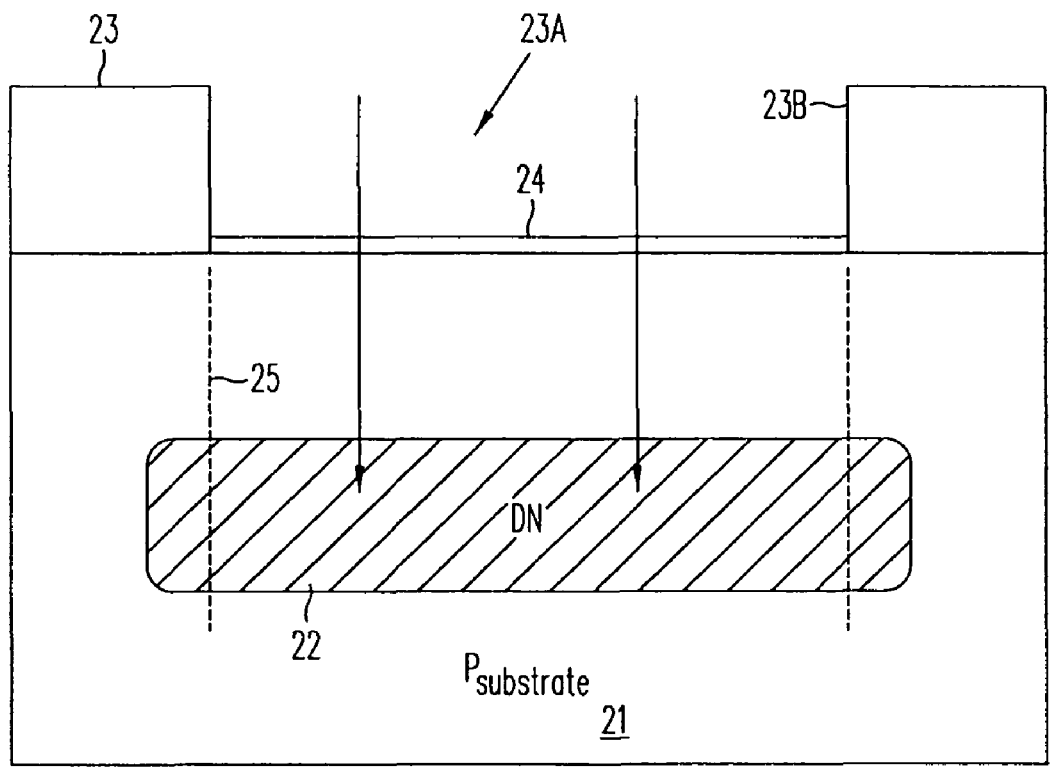
FIGS. 7A-7E illustrate a process flow for forming a self-aligned isolation structure wherein the trench is formed before the floor isolation region is implanted.
Figure 7B:
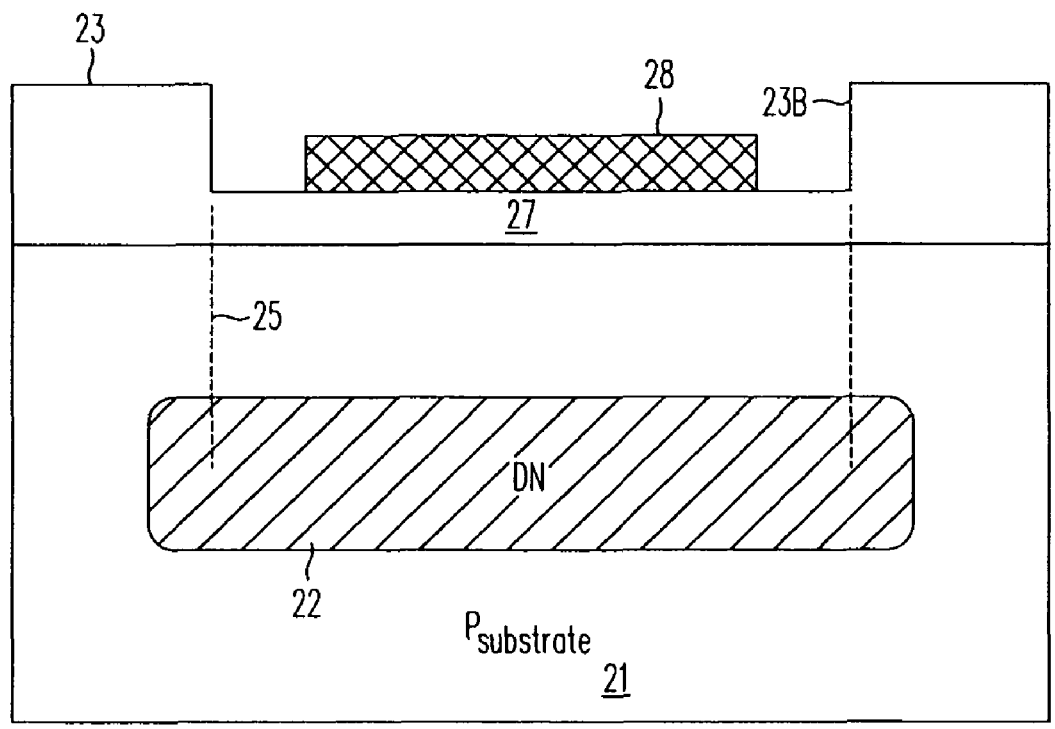
Figure 7C:
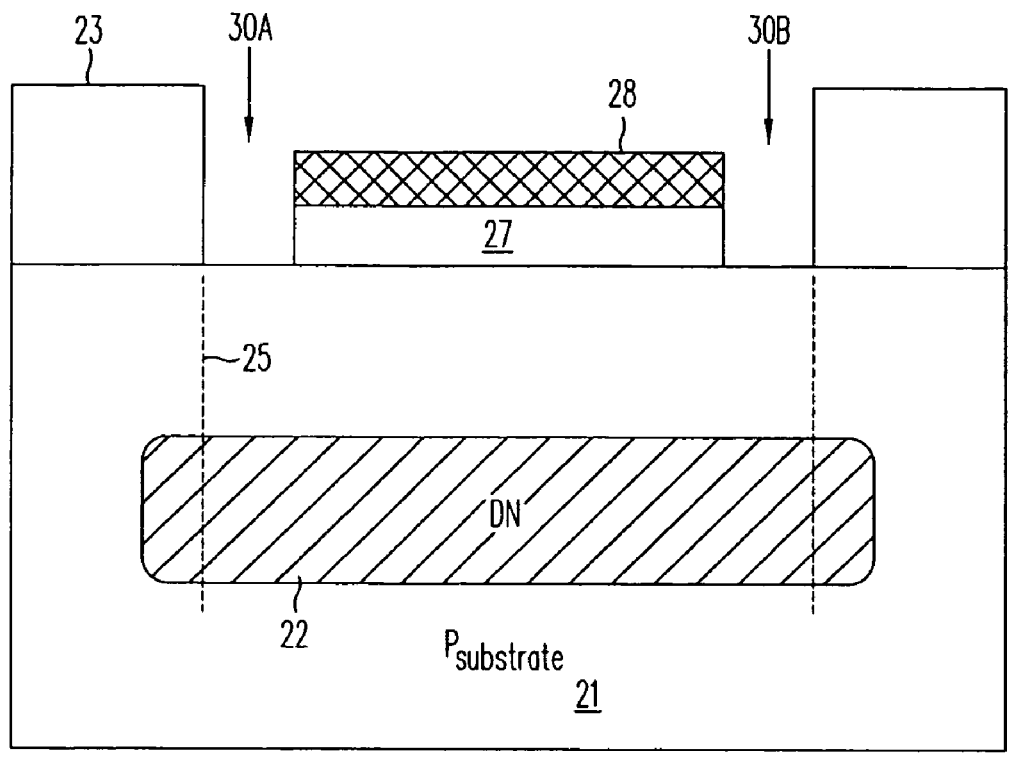

In the isolation structure of FIG. 6D, isolation trenches 11A and 11B are not self-aligned to the edges of DN floor isolation 3. An alternative manufacturing process sequence, illustrated in FIGS. 7A-7E, self-aligns the outer edge of the isolation trenches with the DN region. FIG. 7A shows this structure after DN floor isolation region 22 is implanted at a high energy through an opening 23A in mask layer 23. An edge 23B of mask layer 23 surrounds opening 23A. DN region 22 has an outer peripheral edge 25 which is closely aligned vertically with the edge 23B of mask layer 23. The implant may be performed through thin pre-implant oxide layer 24. In FIG. 7B, mask layer 27 is subsequently formed and masked by patterned mask region 28. While mask region 28 may also be formed atop mask layer 23, in this self-aligned embodiment, there should be a gap between mask region 28 and edge 23B of mask layer 23. In FIG. 7C, mask layer 27 has been etched to form windows 30A and 30B as defined by mask 28 and by mask 23. During the etching of mask layer 27, some erosion of mask layer 23 may occur, but sufficient thickness of mask layer 23 remains to serve as a hard mask during trench etching. After mask layer 27 is etched, mask 28 is preferably removed.

Figure 7D:
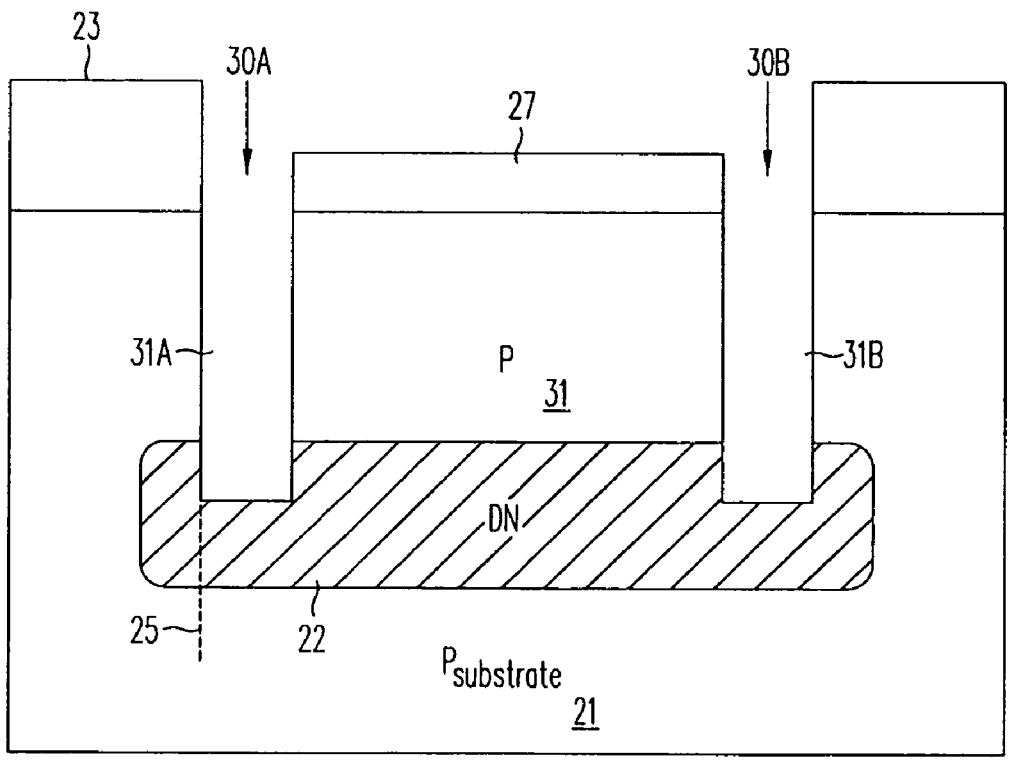
Figure 7E:
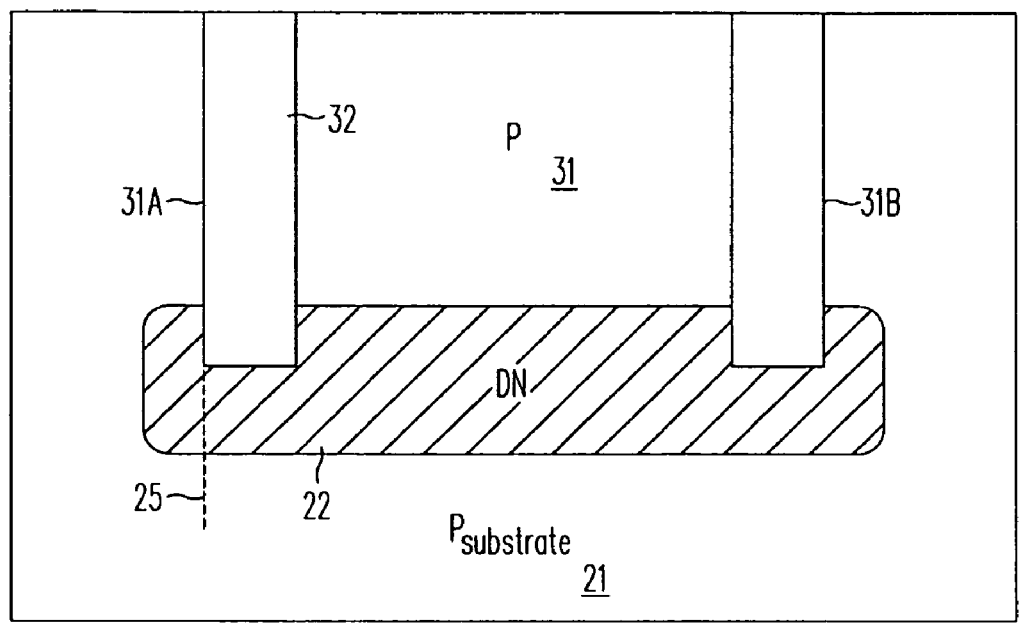

In FIG. 7D, sidewall trenches 31A and 31B have been etched in substrate 21 through openings 30A and 30B to a depth such that trenches 31A and 31B extend into DN floor isolation region 22. The outer edges of trenches 31A and 31B are aligned with edge 25 of DN floor isolation layer 22, since openings 30A and 30B use mask layer 23 to define their location. In other words, since mask layer 23 defines both the outer edges of the sidewall trenches 31A and 31B and the edge 25 of the DN floor isolation region 22, the floor isolation and trench sidewall isolation are "self-aligned" and do not depend on mask alignment, eliminating any variability associated therewith. Trenches 31A and 31B are filled with dielectric material 32 and planarized, resulting in the self-aligned isolation structure shown in FIG. 7E, which isolates one or more P-type pockets 31 from substrate 21 without the need for long thermal diffusions or epitaxial layers.

Figure 8A:
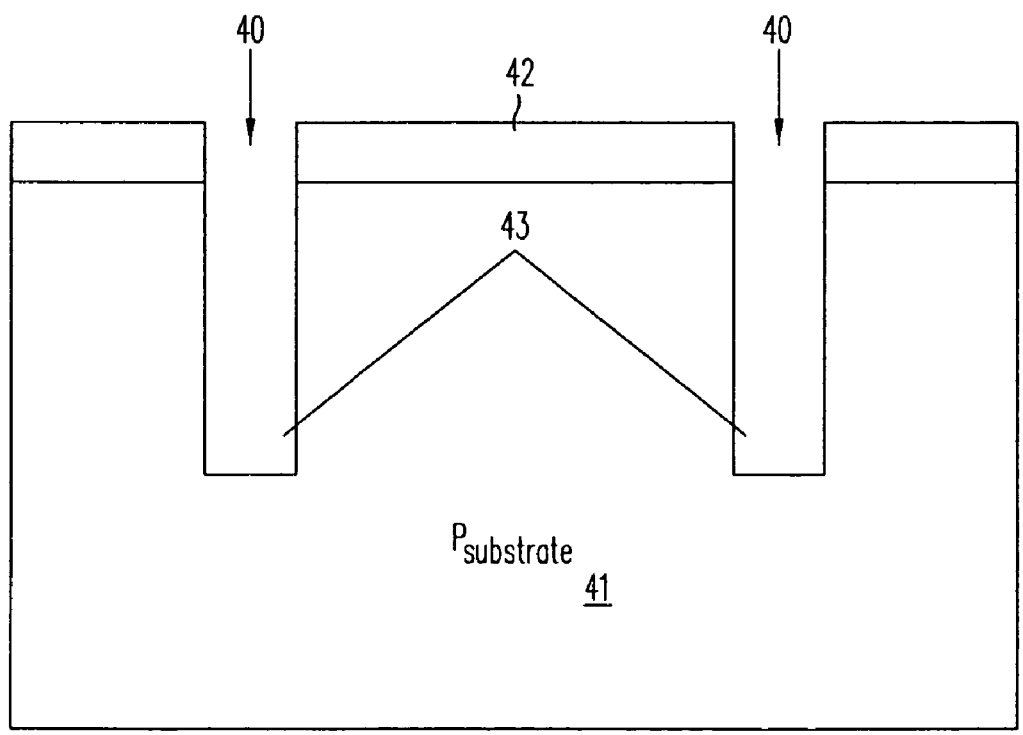
FIGS. 8A-8E illustrate an alternative process flow for forming an isolation structure wherein the trench is formed before the floor isolation region is implanted.
Figure 8B:
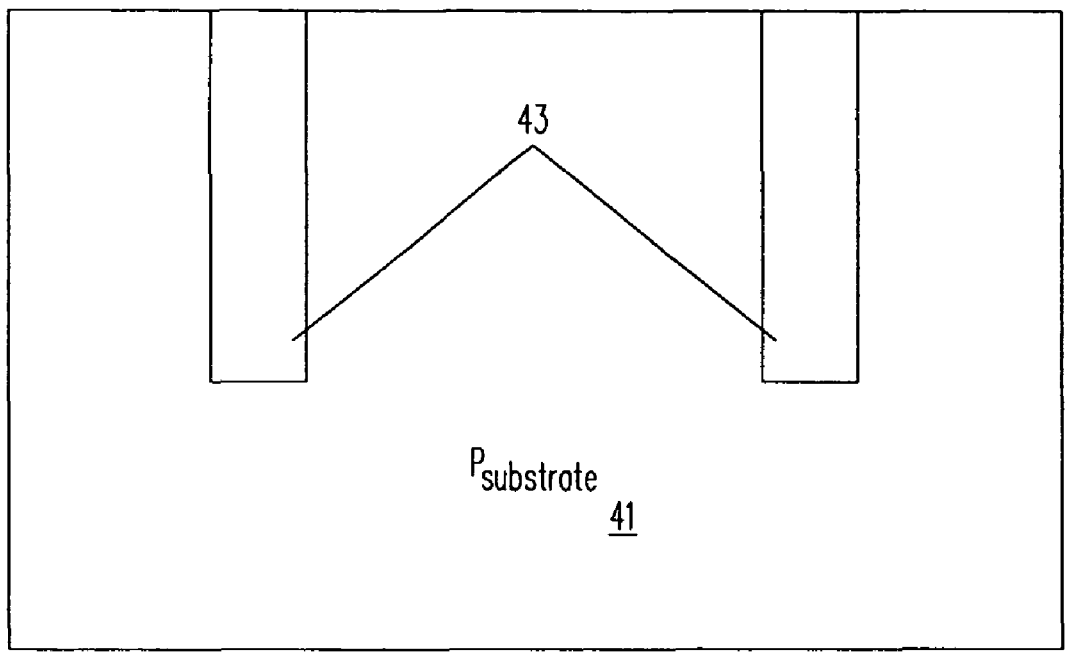
Figure 8C:
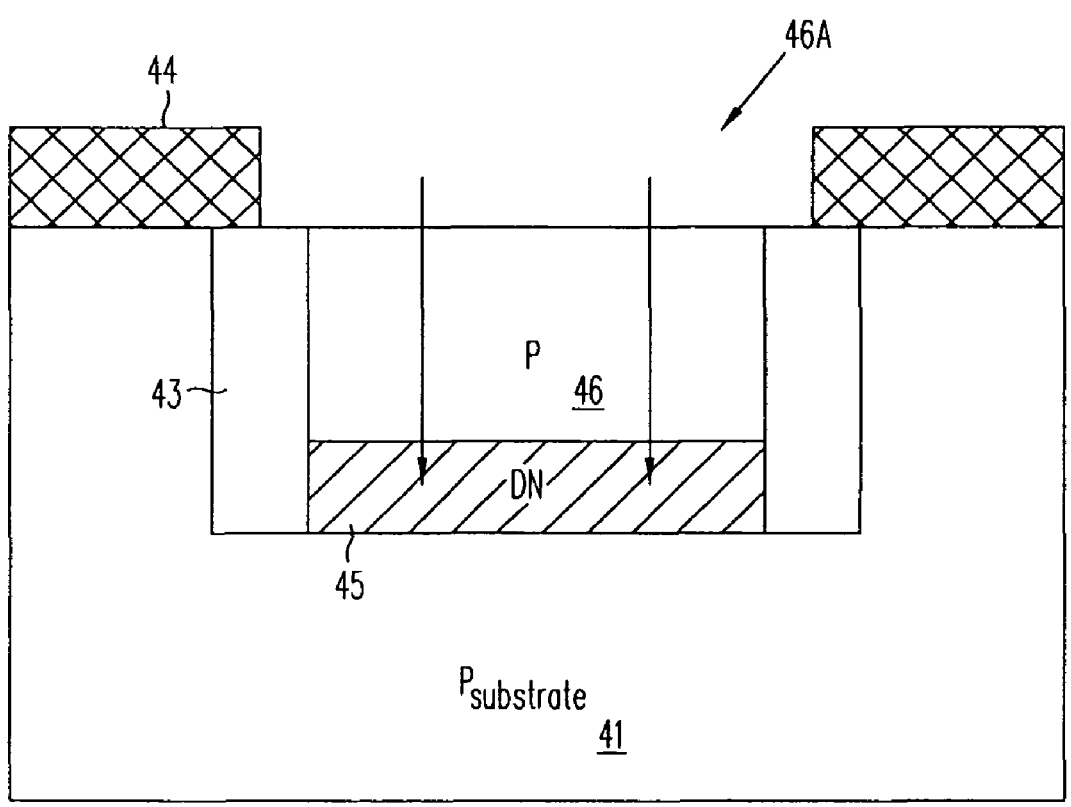

In the alternative self-aligned fabrication sequence illustrated in FIGS. 8A-8E, the re-filled trenches are formed prior to implantation of the DN floor isolation region. As shown in FIG. 8A, trenches 43 have been etched in substrate 41 through openings 40 in mask 42. The trenches 43 are then filled and planarized to form filled trenches, as shown in FIG. 8B. As shown in FIG. 8C, mask layer 44 is patterned to form an opening 44A, followed by a high-energy ion implantation of DN region 45 extending between adjacent trenches 43.

By aligning the edges of the opening 44A in mask layer 44 atop filled trench 43, the portion of DN region 45 that is electrically active in the substrate is self-aligned to trenches 43. Thus, DN region 45 and trenches 43 isolate P-type pocket 46 from substrate 41 in a self-aligned manner as shown in FIG. 8D, using less space than mask alignment dependent versions.

Figure 8D:
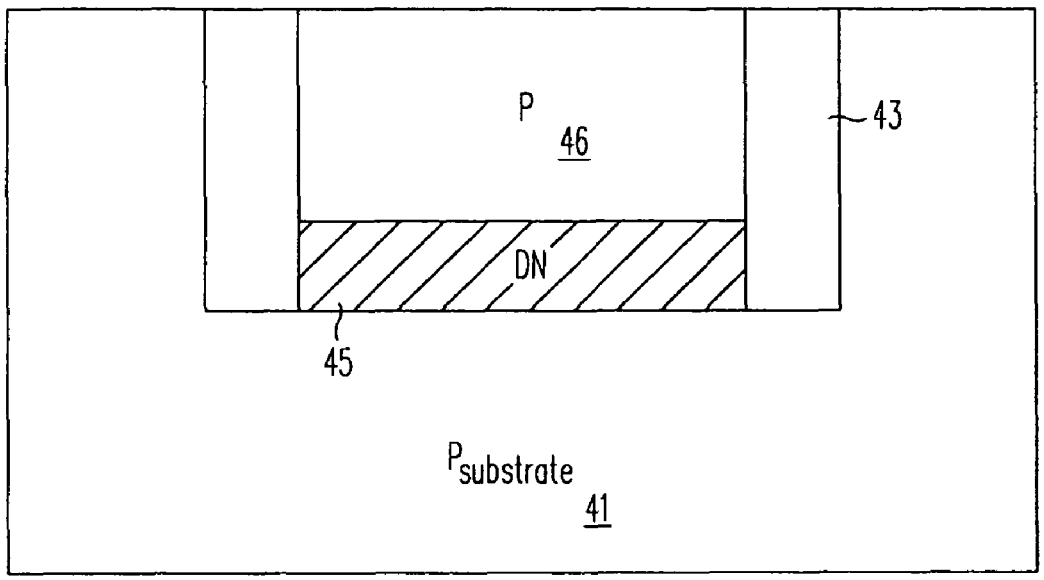
Figure 8E:
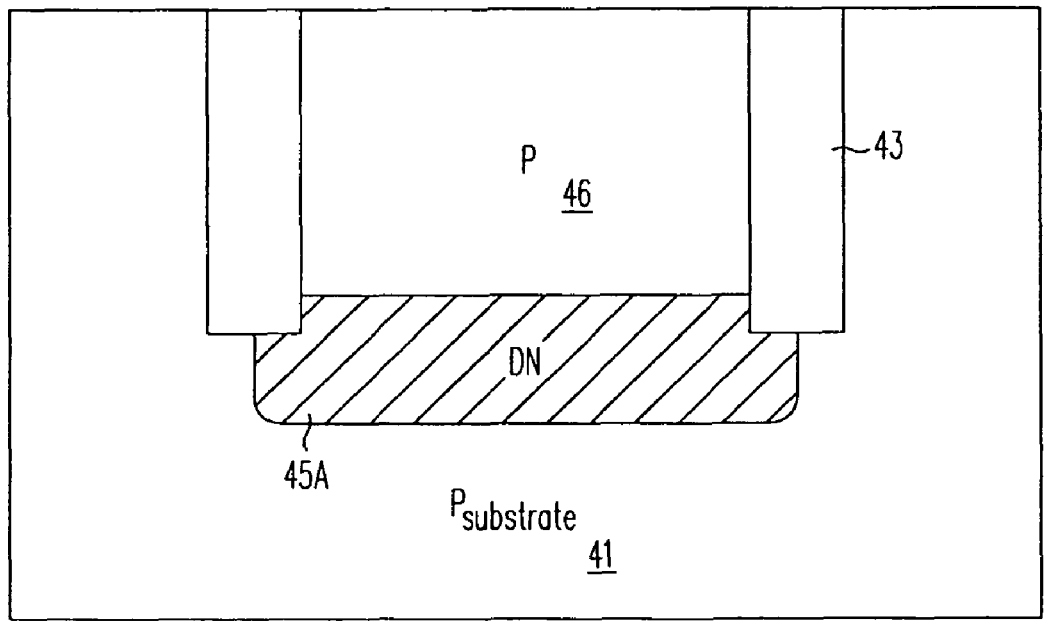

While FIG. 8D shows the bottom of DN region 45 being at approximately the same depth as the bottom of trenches 43, in other embodiments the DN region may have a different vertical depth. For example, FIG. 8E shows an isolation structure in which DN region 45A extends below the bottom of trenches 43. Some penetration of DN region 45A through trench 43 may occur, but the elements are still substantially self-aligned.

Figure 9A:
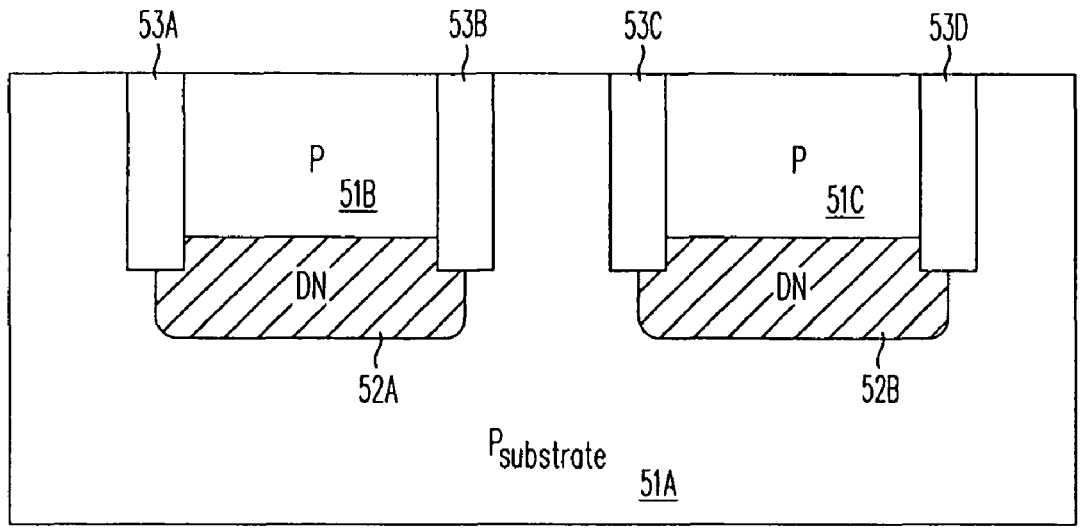
FIGS. 9A-9D illustrate a process flow for forming deep implanted P-type region within an isolated pocket and between isolated pockets.

In any of the isolation structures shown herein, an optional P-type region may also be masked and implanted in P-type substrate 2 at a depth shallower than, deeper than, or equal to the DN region. By way of example, FIGS. 9A-9D illustrate a process for forming a deep P-type region (DP) either within the isolated pocket or between isolated regions. In FIG. 9A, two isolated P-type pockets 51B and 51C are formed in common P-type substrate 51A using one of the processes described above. Pockets 51B and 51C are isolated by trenches 53A, 53B, 53C, and 53D, along with DN regions 52A and 52B.

Figure 9B:
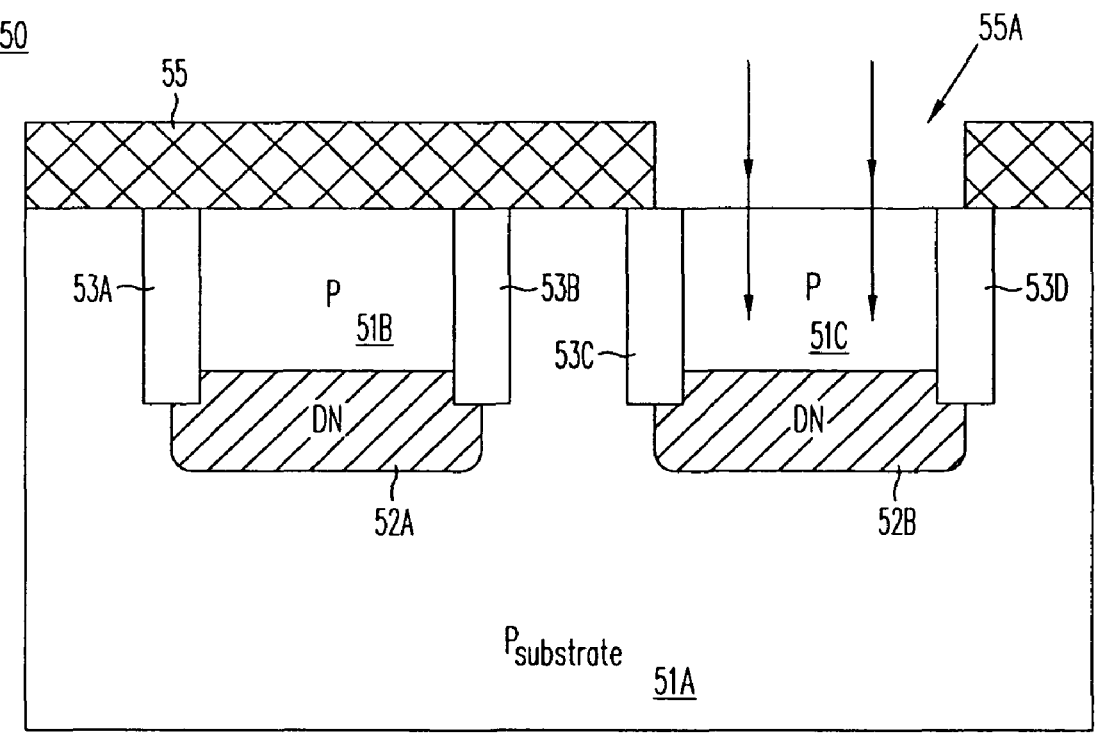
Figure 9C:
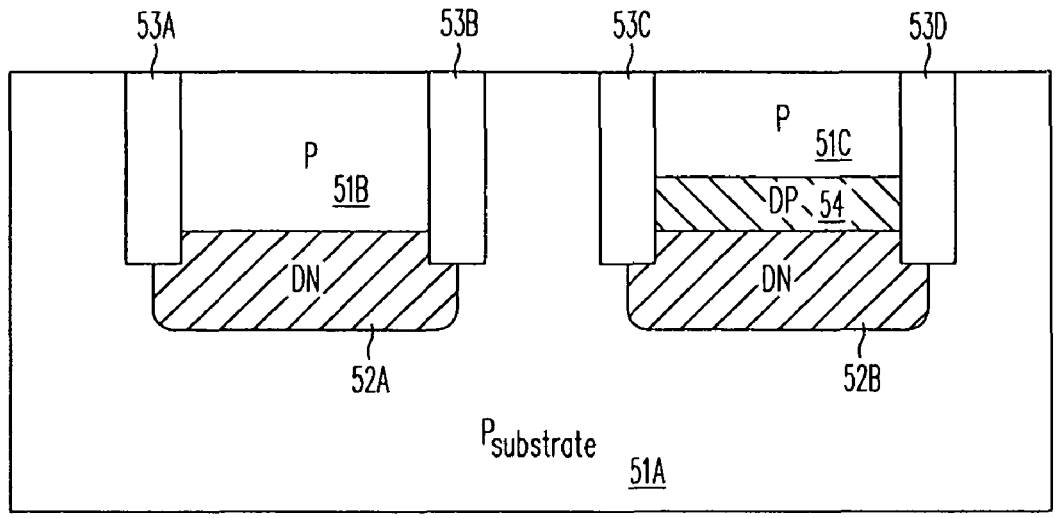

FIG. 9B illustrates patterned mask layer 55, which has been patterned to form an opening 55A over isolated pocket 51C. Mask layer 55 is thick enough to allow a high energy implant to selectively dope P-type isolated pocket 51C without doping substrate 51A or isolated pocket 51B. FIG. 9C shows the resulting DP region 54 sharing the isolated pocket 51C with P-type material that was isolated from substrate 51A. By positioning the edges of opening 55A above trenches 53, the active portion of DP region 54 is self-aligned to the trenches.

DP region 54 may be formed using the high-energy implantation of boron, at any depth, but generally at a depth equal to or shallower than the DN region 52B. The implantation of boron to a given depth requires a lower energy than an implantation of phosphorus to the same depth, e.g. from 0.8 MeV to 2.0 MeV, since a boron atom is smaller and less massive than a phosphorus atom. In a preferred embodiment, DP region 54 is implanted sufficiently deep such that it does not substantially change the surface concentration of a remaining portion of P-type pocket 51C. Boron implant doses for the DP region 54 may range from 1E12 cm$^{-2}$ to 1E14 cm$^{-2}$ but typically a dose in the 5E12 cm$^{-2}$ to 5E13 cm$^{-2}$ range is used.

Figure 9D:
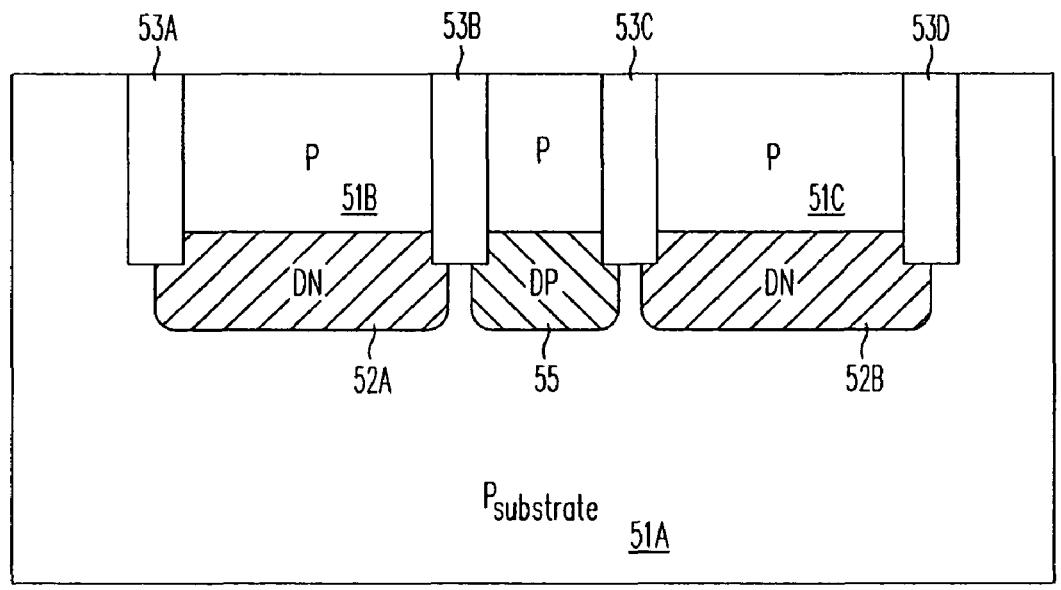

FIG. 9D shows another embodiment, in which DP region 55 is implanted in between two isolated pockets to inhibit the onset of punch-through breakdown or leakage between DN regions 52A and 52B. While DN regions 52A and 52B could be electrically floating, they are preferably biased to a potential more positive than the substrate, and therefore form reverse biased P-N junctions. The bias present on each of DN regions 52A and 52B may be the same or DN regions 52A and 52B may be biased at different potentials. Moreover, each of DN regions 52A and 52B may have a fixed potential or a potential that varies with time.

In general, each isolated pocket may contain devices that are biased at any potential equal to or more negative than the DN bias potential of that pocket. For example if the DN is biased to 5V, a device inside the isolation region may operate at a voltage up to 5V or at a voltage as negative as the breakdown mechanisms of the device allow, perhaps even at a voltage more negative than the potential of P-type substrate 51A.

Figure 10A:
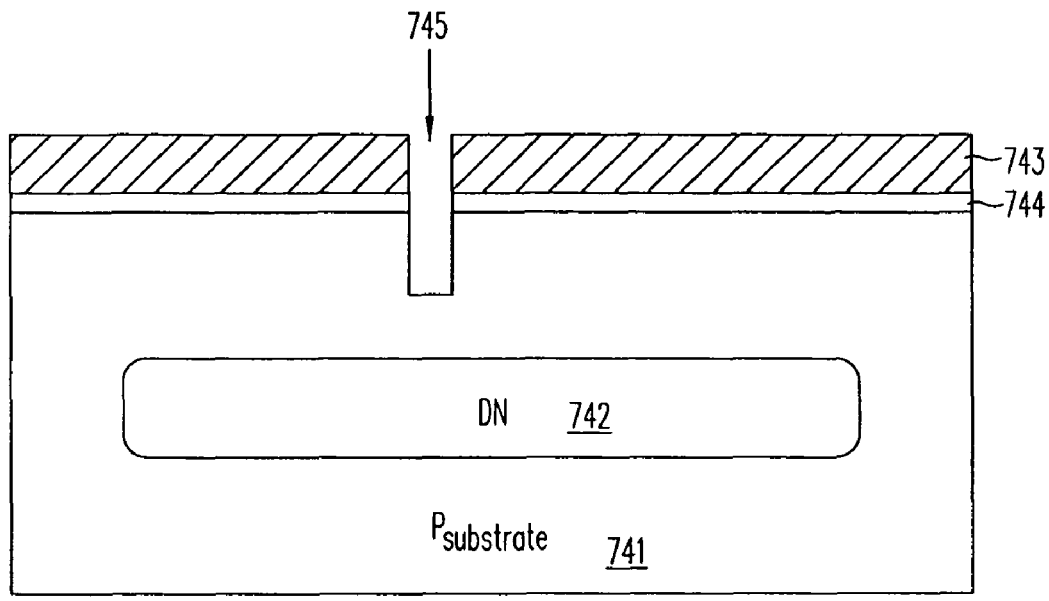
FIGS. 10A-10G illustrate a process flow for forming an isolation structure with conductive-filled trenches along with one or more shallow trench isolation (STI) trenches.

FIGS. 10A-10F illustrate the formation of an isolation structure that includes implanted DN regions contacted by conductive trench refill regions. FIG. 10A shows the structure after formation of the DN region 742, as described above, and deposition and patterning of optional planarization etch-stop layer 744, made of silicon nitride or other suitable material, and mask layer 743, preferably a hard mask of deposited oxide or other suitable material. A shallow trench 745 is etched into P-substrate 741 through openings in mask 743. Trenches 745 are preferably compatible with standard STI of a given CMOS technology.

Figure 10B:
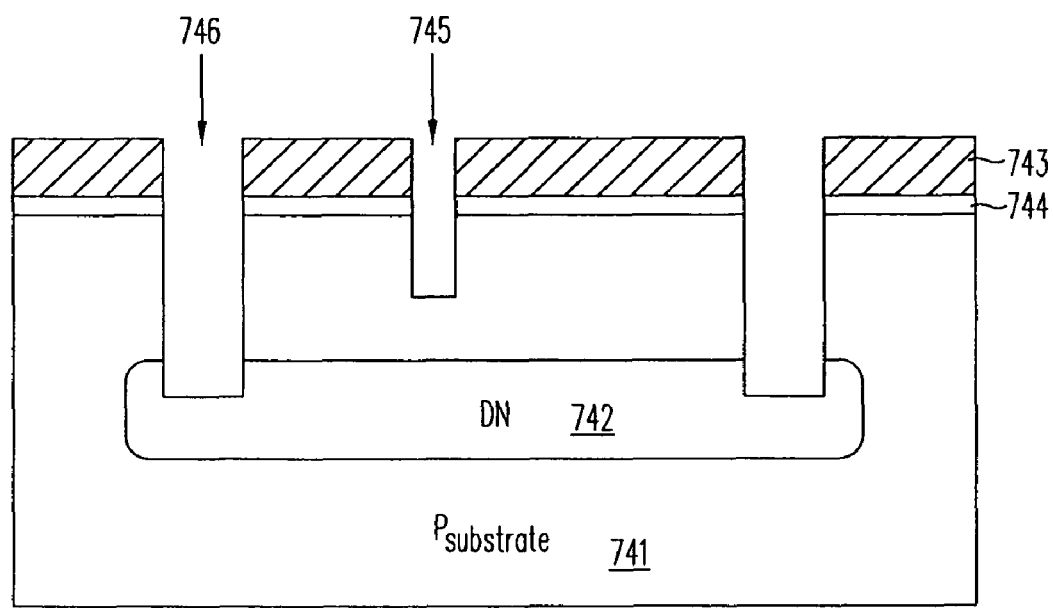

FIG. 10B shows the structure after patterning and etching of trenches 746. These trenches are deeper than trenches 745, and extend into the DN region 742. Trenches 746 are also wider than trenches 745, to allow formation of dielectric refill in trenches 745 and conductive/dielectric refill in trenches 746, as described below. By way of example, trenches 745 may be about 0.5 micron wide and 0.5 micron deep, while trenches 746 may be about 1 micron wide and 1.5-2.0 microns deep.

Figure 10C:
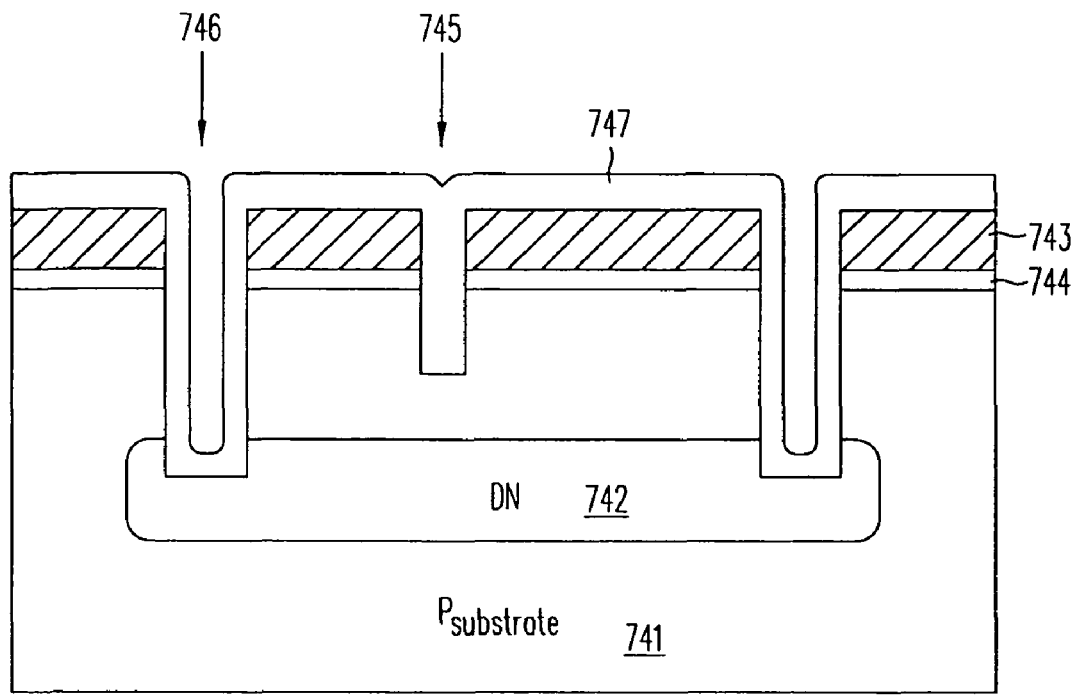

FIG. 10C shows the structure after deposition of a dielectric layer 747. The dielectric layer 747 preferably has good conformality, for example a TEOS deposited oxide may be used. The deposition thickness is designed to completely refill narrow trenches 745, but only cover the sidewalls of wider trenches 746. In the example given here, a 0.3 micron thickness could be used to completely refill the 0.5 um wide shallow trenches 745 and form a 0.3 micron layer on each sidewall of the deep trenches 746, leaving a 0.4 micron wide space in the deep trenches 746.

Figure 10D:
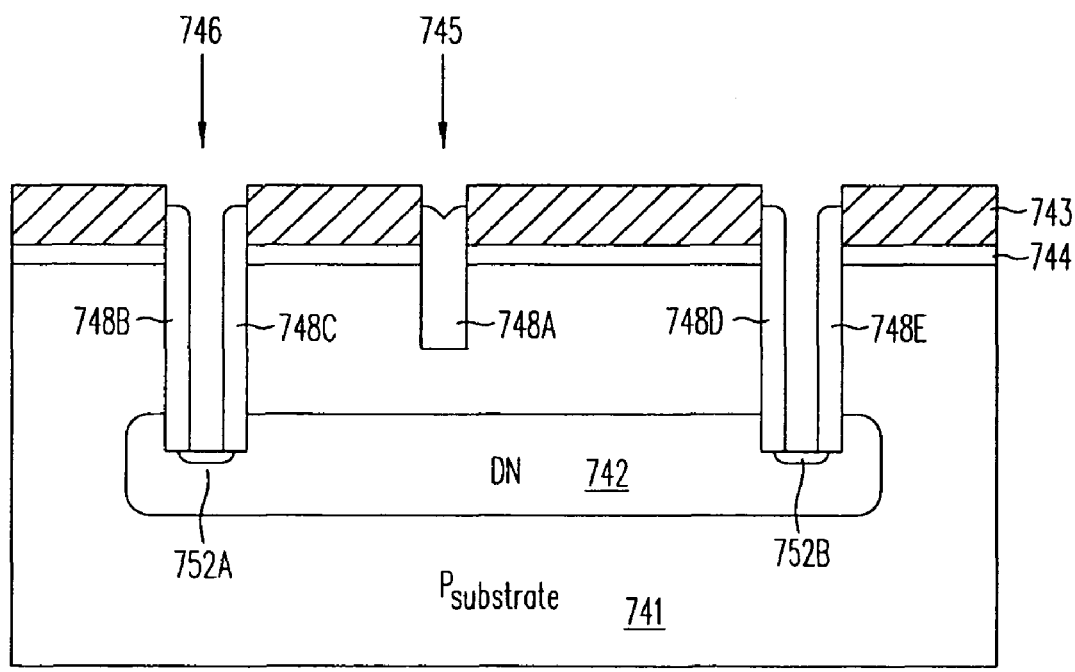

FIG. 10D shows the structure after etchback of the dielectric layer 747. The etchback, preferably done by reactive ion etching techniques, should entirely remove the dielectric 747 from the bottom of the deep trenches 746. In doing so, the dielectric 747 will likely also be removed from the surface, and the underlying mask layer 743 may also be etched, depending on the materials used and their relative etch rates. After this etchback step, sidewall dielectric layers 748B, 748C, 748D, and 748E remain in deep trenches 746, while shallow trenches 745 are completely filled by dielectric region 748A, which should extend above the original surface of substrate 741. As shown in FIG. 10D, optional implant regions 752A and 752B may be introduced into the opening at the bottom of each wide trench. No masking layer is required, since the substrate is only exposed in these areas. This implant is preferably a high-dose, low-energy N-type implant, for example phosphorous at 30 keV and 1×10$^{15}$ cm$^{-2}$, which may improve the contact from the conductive fill (described below) to the DN region.

Figure 10E:
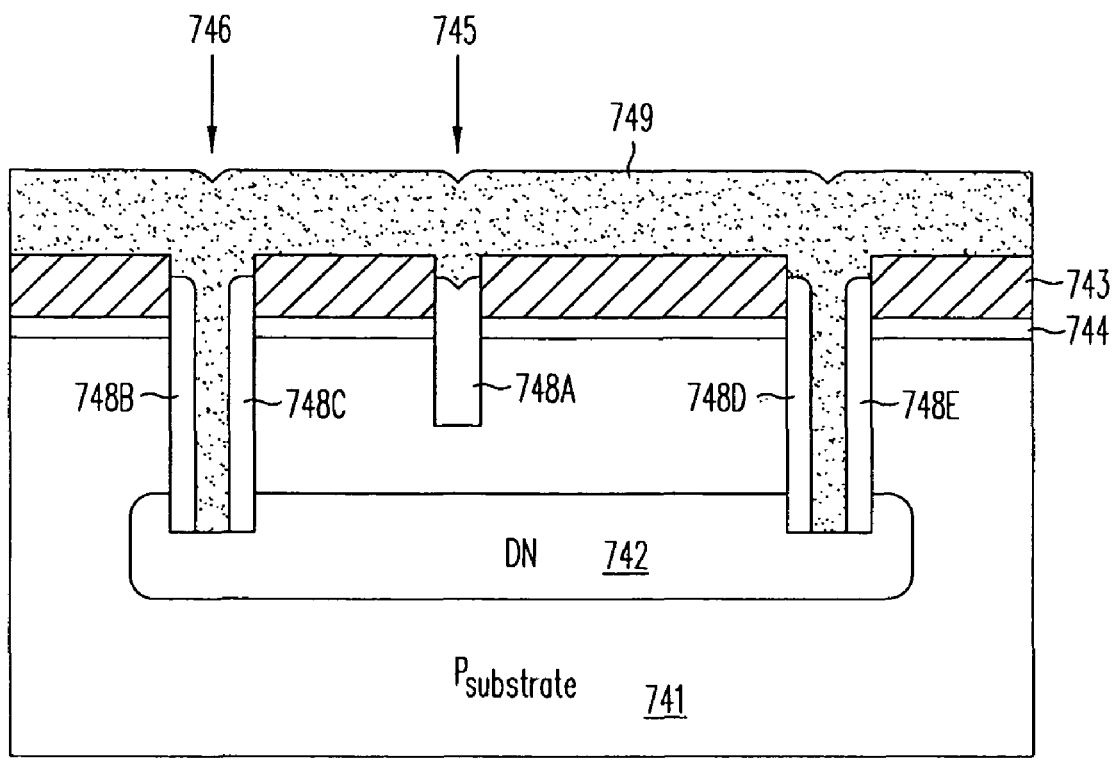

FIG. 10E shows the structure after deposition of a conductive layer 749, which is preferably highly conductive and conformal, such as in-situ doped polysilicon. The deposition thickness of layer 749 is designed to provide complete refill of deep trenches 746. Note that the etched width of each trench determines whether it is filled completely by dielectric or partially by conductive material. Thus, it is also possible to form wide, shallow trenches that have a conductive central portion, which may be advantages, for example, in forming buried contacts to regions in certain device structures. Likewise, it is possible to form narrow, deep trenches that are completely filled with dielectric, which may be useful in forming lateral isolation between adjacent DN regions.

Figure 10F:
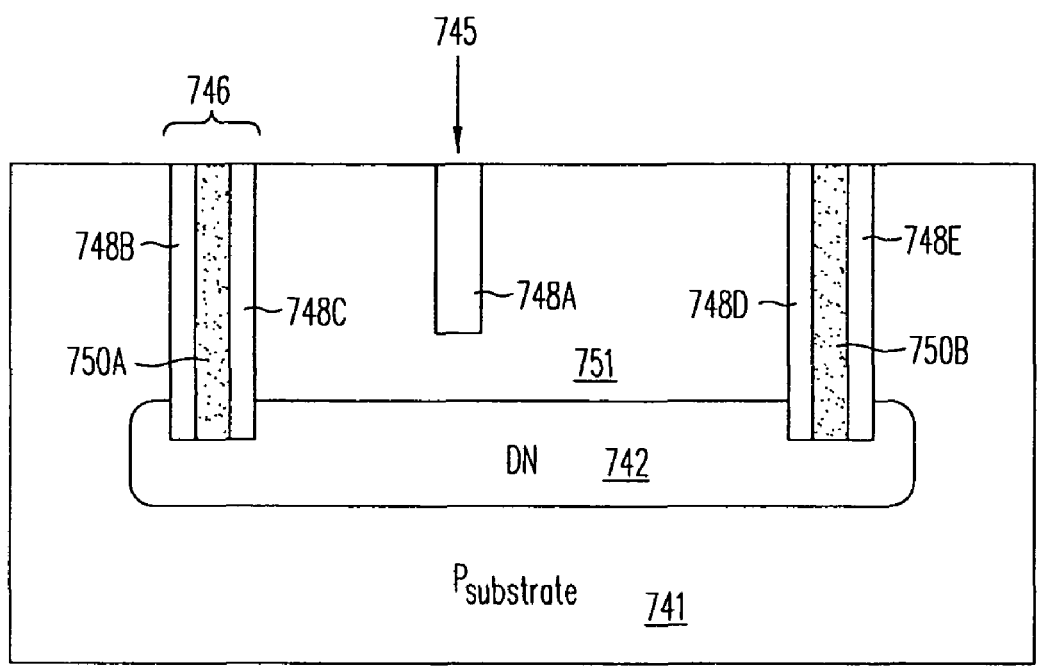

FIG. 10F shows the isolation structure after planarization. In this example, the structure has been planarized back to the original surface of substrate 741. This is preferably accomplished by CMP and/or etchback processes. The final structure comprises isolated P-type region 751 which is isolated by DN region 742 on the bottom and by refilled trenches 746 on the sides. Trenches 746 are partially filled with conductive material 750A and 750B, which provides electrical contact to DN region 742. The conductive material 750A is surrounded by sidewall dielectric layers 748B and 748C, and the conductive material 750B is surrounded by sidewall dielectric layers 748D and 748E. As a result, conductive material 750A and 750B are isolated from P-type region 751 and substrate 741.

Figure 10G:
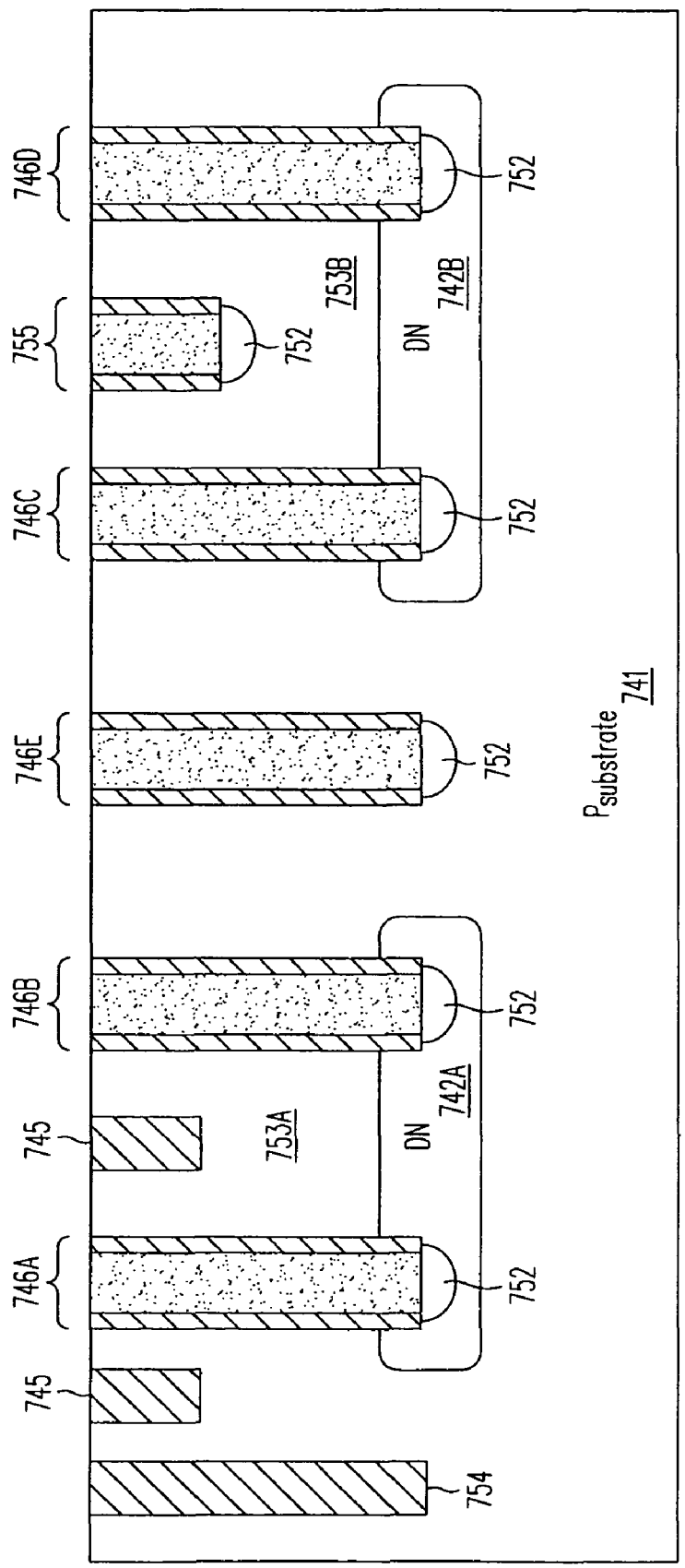

FIG. 10G shows a completed structure with several of the features described above, including two separate DN regions 742A and 742B. DN region 742A is contacted by conductive material in filled trenches 746A and 746B. DN region 742B is contacted by conductive material in filled trenches 746C and 746D. Isolated pockets 753A and 753B are isolated from substrate 741 by the DN regions 742A and 742B and filled trenches 746A-746D. Conductive-filled trench 746E is placed between the DN regions 742A and 742B and may serve, for example, as a dummy collector for minority carriers in the P-type substrate 741. Each of the conductive filled trenches 746A-746E includes an optional N-type implant 752 at the bottom. Shallow, dielectric-filled trenches 745 may be included within the isolated pockets 753A and 753B and/or in the substrate 741 outside the isolated pockets 753A and 753B. Deep dielectric-filled trenches 754 may also be included in any area. Shallow conductive-filled trenches 755 may also be formed.

The isolation structures shown in FIG. 10G advantageously provide very compact electrical connections to the DN regions 742A and 742B, via deep conductive filled trenches 746A-746D. Moreover, the formation of trenches 746A-746D shares many steps in common with the formation of STI trenches 745, including dielectric deposition and planarization steps, so there is little added process complexity to provide contact from the surface to the DN regions 742A and 742B.

Figure 11A:
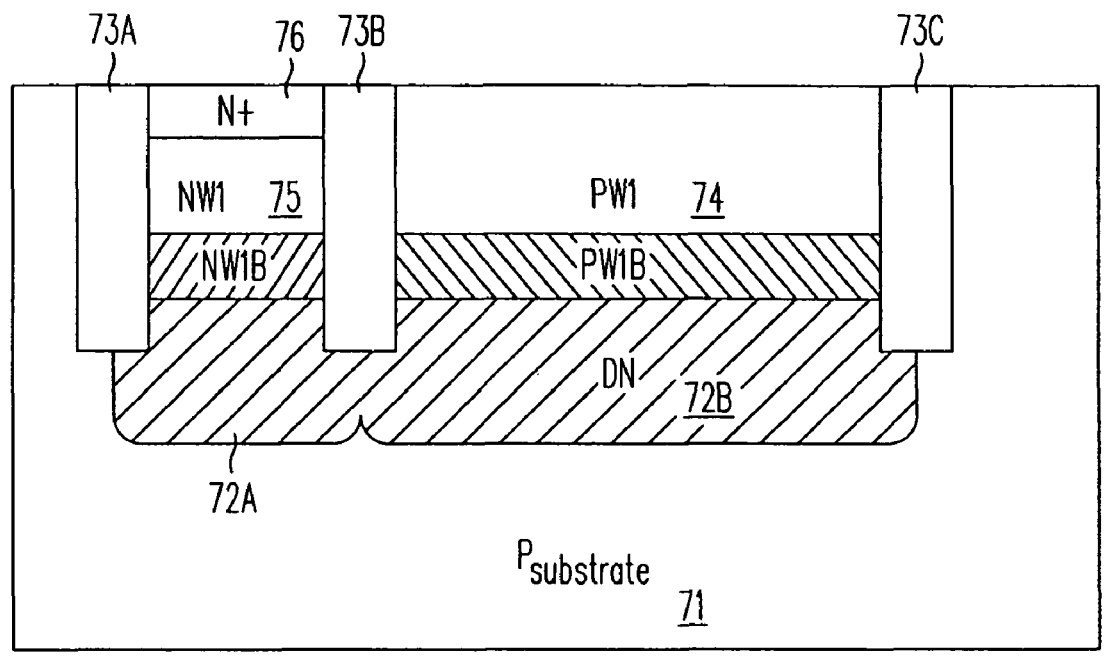
FIGS. 11A-11C illustrate alternative methods of electrically contacting a floor isolation region using a implanted well.
Figure 11B:
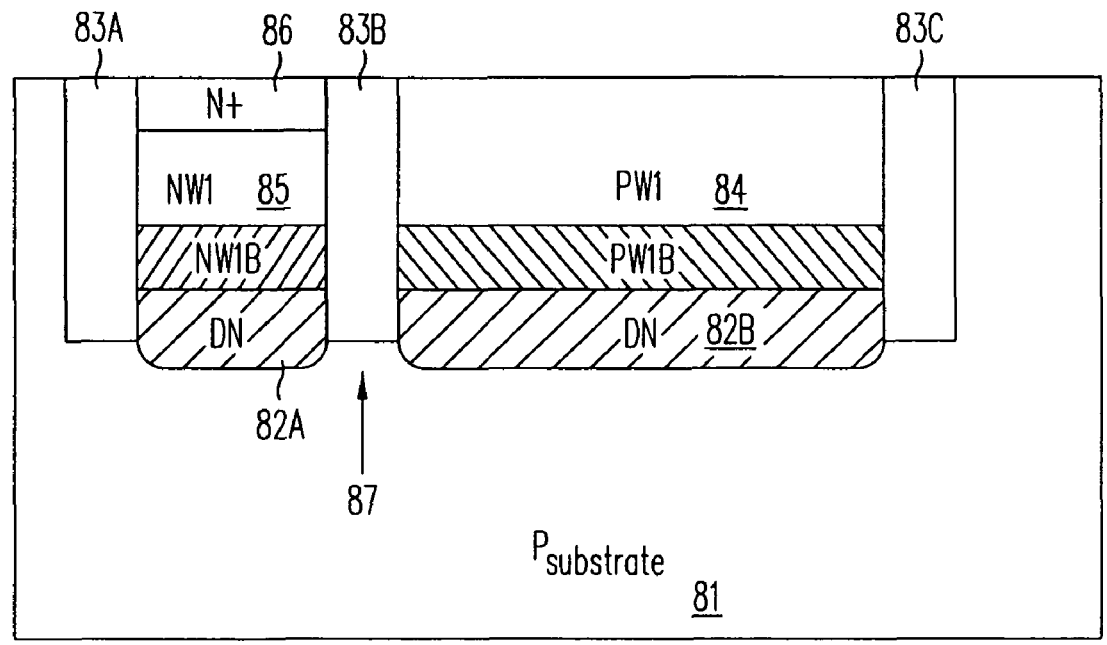
Figure 11C:
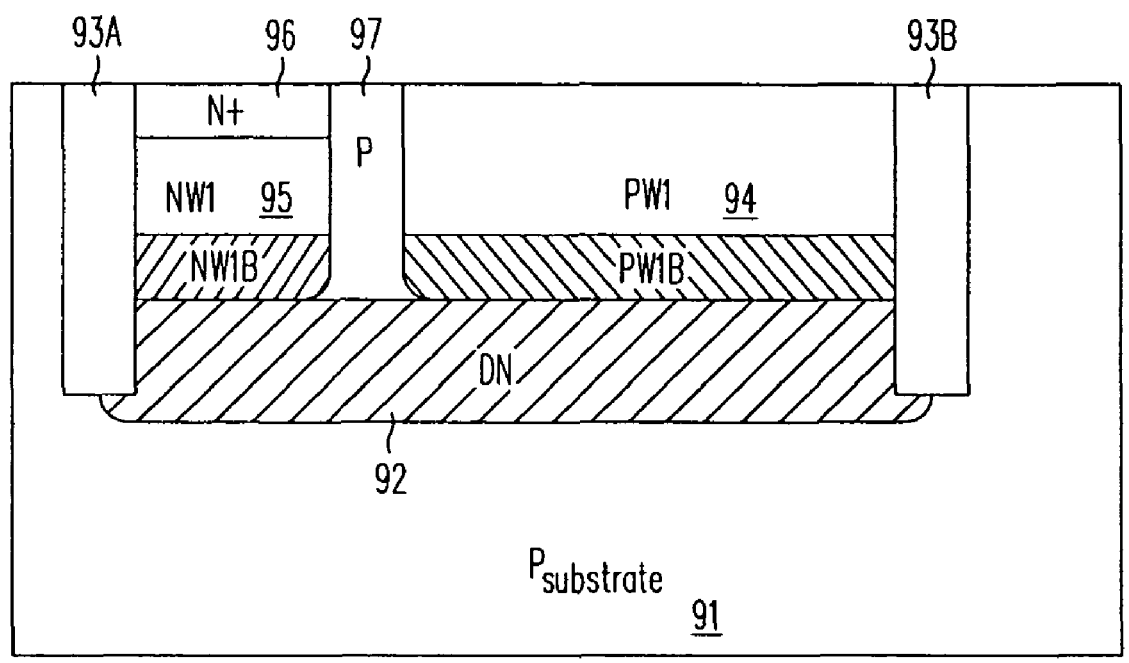

FIGS. 11A-11C illustrate several ways of making electrical contact to a DN region without using the conductive refill technique described above. In FIG. 11A, trenches 73A, 73B and 73C are located atop and vertically overlap onto DN regions 72A and 72B, which are connected laterally, thereby isolating P-type well 74 from substrate 71. To provide surface contact to DN regions 72A and 72B, N-type well 75 and N+ region 76 are included, where N-type well 75 vertically overlaps onto DN region 72A. Trenches 73A and 73C isolate the entire structure from other devices, while trench 73B is a partition trench that separates N-type well 75 from P-type well 74 to prevent electrical interaction between these wells.

The embodiment shown in FIG. 11B includes trenches 83A, 83B and 83C located atop and vertically overlapping DN floor isolation regions-82A and 82B, thereby isolating P-type well 84 from substrate 81. To contact DN region 82A, N-type well 85 and N+ region 86 are included, where N-type well 85 vertically overlaps onto DN region 82A. Trenches 83A and 83C isolate the entire structure from other devices, while trench 83B is a partition trench that separates N-type well 85 from P-type well 84 to prevent electrical interaction between the wells. DN regions 82A and 82B do not directly contact each other, as they are separated by trench 83B. In this case, the electrical bias on DN region 82B may still be influenced by the bias on DN region 82A via a combination of leakage current and punch-through. However, compared to the structure of FIG. 11A, this arrangement does not provide as low an electrical resistance from the surface to DN region 82B.

Another embodiment is shown in FIG. 11C, where DN floor isolation region 92 and trenches 93A and 93B isolate P-type well 94 from substrate 91 and where N-type well 95 and N+ region 96 facilitate contact from the surface to DN region 92. In this configuration, no trench separates the N-type well 95 and P-type well 94. Instead an area 97 of the substrate 91, separates the wells 94 and 95. This structure may be preferable to that of FIG. 11B for processes in which the trench is deeper than the DN region, because N-type well 95 has a large overlap with DN region 92 to provide good electrical contact, while the structure of FIG. 11A may be preferable for processes in which the trench is shallower than the bottom of the floor isolation region, because trench 73B provides lateral isolation of N-type well 75 from P-type well 74 while a portion of DN region 72 illustrates various process fabrication sequences to form isolation structures according to this invention. In general, fabrication commences with a substrate which in a preferred embodiment is P-type without an epitaxial layer, but may comprise N-type material without an epitaxial layer, or may even comprise a P-type epitaxial layer grown atop a P-type or N-type substrate, or N-type epitaxial layer grown atop an N-type or P-type substrate. It will be well known to those skilled in the art, that if an N-type substrate material is employed, floor isolation requires the formation of a DP floor isolation region rather than a DN floor isolation region, and other doped regions will be reversed as needed to form junction isolation.

Figure 12:
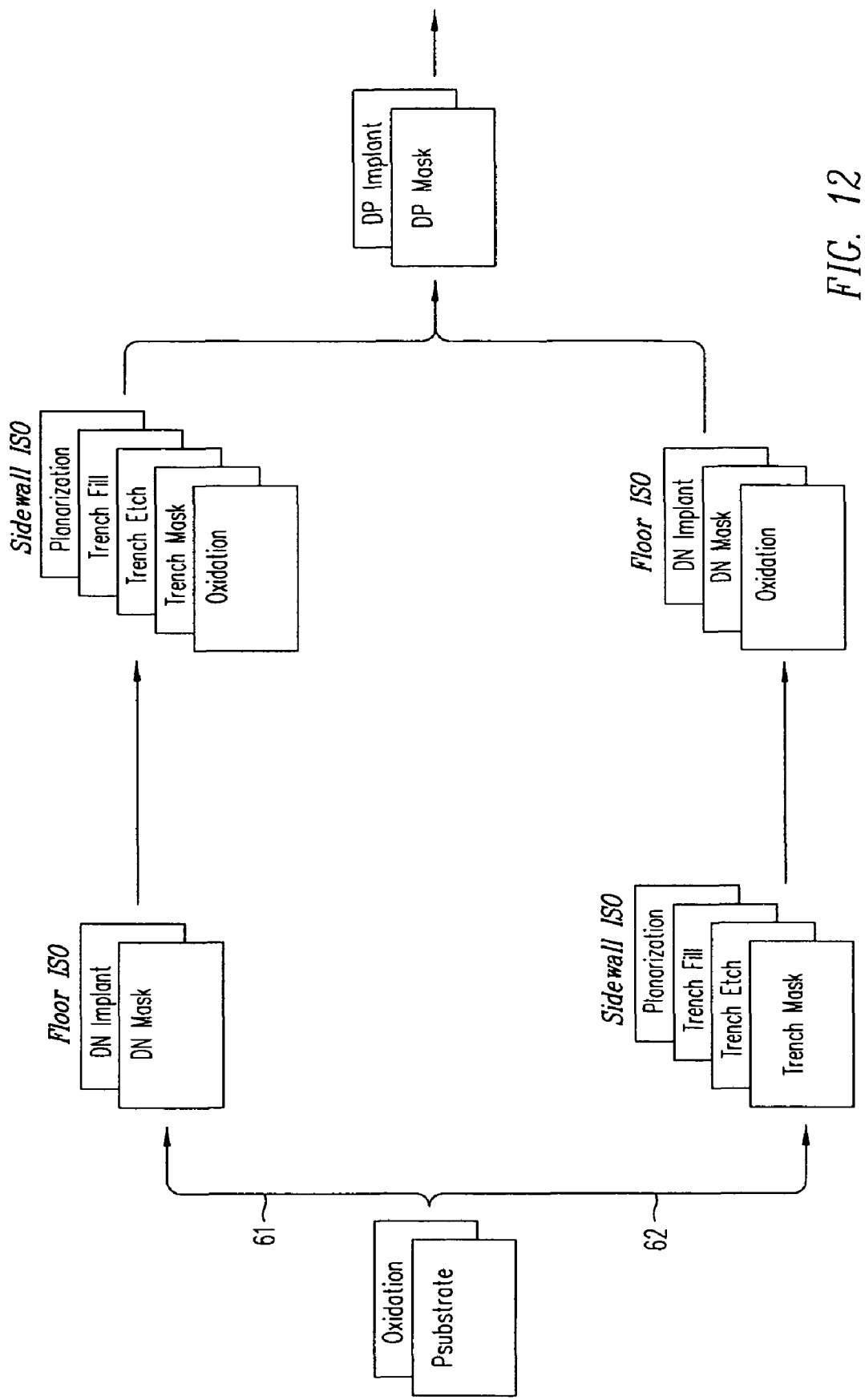
FIG. 12 is a flow diagram illustrating various fabrication processes for forming isolation structures according to the invention.

FIG. 12 illustrates two basic process flows. In flow 61, the floor isolation region is formed before the isolation trench, while in flow 62, the isolation trench is formed before the floor isolation region. The resulting structure may be self-aligned or non-self-aligned, as described above. The etched trench may be oxidized or filled by chemical vapor deposition (CVD), or in a preferred embodiment oxidized first then filled by deposition. If oxidation of the trench occurs after DN floor isolation implantation, up-diffusion of the DN region must be avoided by minimizing the temperature of the oxidation, typically below 900° C. The optional DP layer is shown being formed after the isolation structure is complete, i.e. after sidewall and DN implantation, but in other embodiments could be formed before trench formation, DN formation, or both.

Although only one trench mask and etch are shown in FIG. 12, a second shallower trench may by etched and subsequently filled, as described above. Moreover, the trench fill can comprise dielectric or dielectric plus conductive materials, as described above. If multiple trenches are used, or multiple refill materials are used, it is preferable to share common processes, such as the planarization steps.

Figure 13:
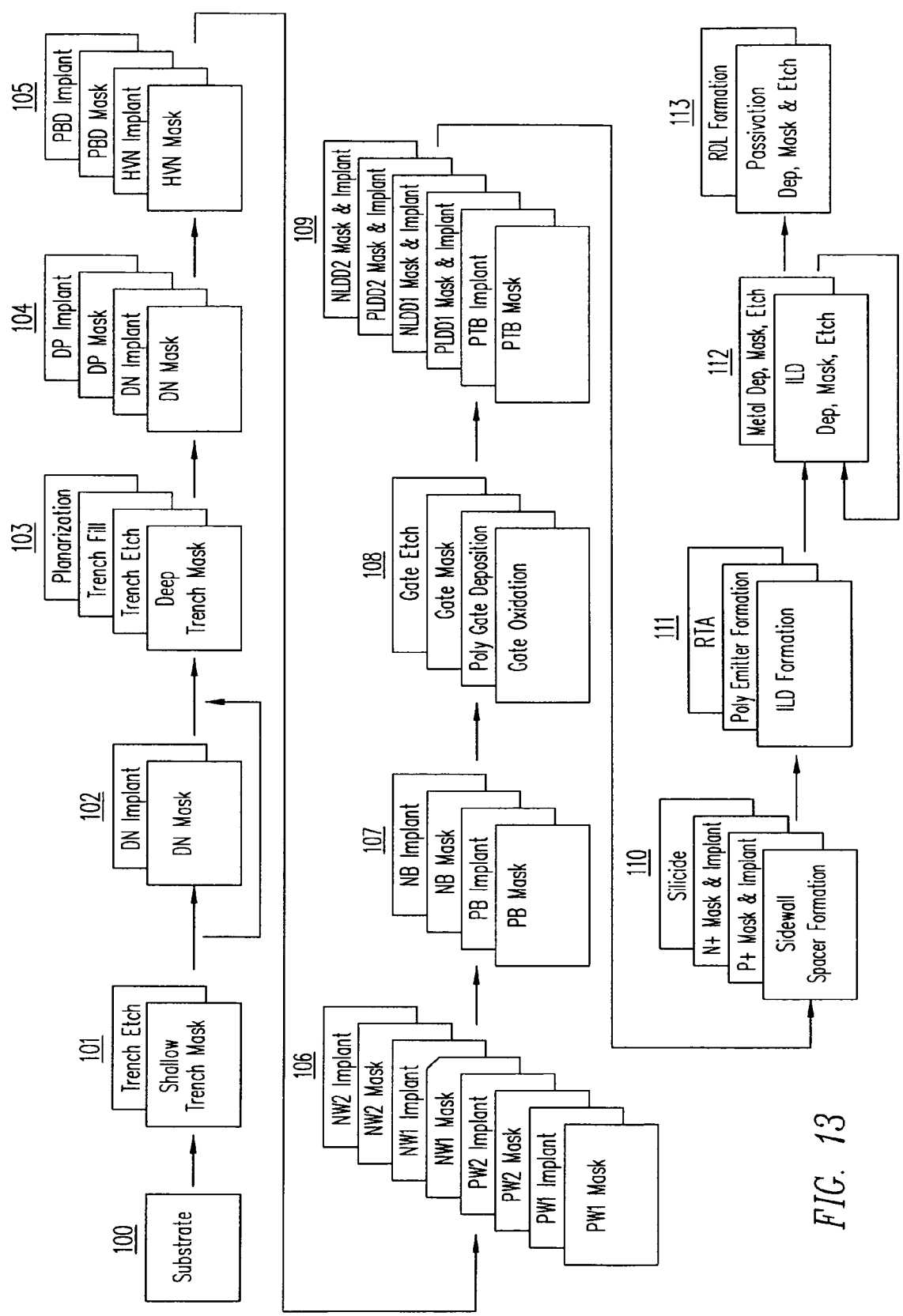
FIG. 13 is a flow diagram of a modular process for fabricating a variety of fully-isolated bipolar, CMOS and DMOS devices in accordance with the invention.

FIG. 13 illustrates a modular process for fabricating a variety of fully-isolated bipolar, CMOS and DMOS devices without the need for high temperature processing or epitaxy. The term "modular" refers to the ability to easily add or remove various sets of processing steps, or "modules," to produce only the devices that are required to fabricate a given circuit design. By creating a modular process architecture, the manufacturing costs can be minimized for a given circuit design by including only the necessary process steps. Moreover, the modules are designed such that eliminating any module does not affect the performance or characteristics of the remaining devices. In this way, a common set of device libraries and models may be used for any of the modular process options.

In principle, because there are no high temperatures required to achieve electrical isolation used the disclosed techniques, the formation of the dielectric filled trenches and of deep N-type (DN) floor isolation regions can be performed in any order without adversely impacting the electrical isolation of integrated devices. In practice, however, some fabrication sequences are preferred since they simplify wafer processing. Details for forming the trench isolation structures are detailed in the aforementioned application Ser. No. 11/444, 102.

In this process, devices are constructed using a combination of masked implants comprising chain-implants or high-energy implants. To achieve final dopant profiles that are substantially as-implanted, only minimal redistribution from diffusions and high temperature processing are possible. As-implanted dopant profiles differ from standard monotonically decreasing concentrations of diffused Gaussian profiles because they can be optimized to set device characteristics independently.

In addition to offering greater flexibility in the sequence of forming the isolation structures, the low-temperature process architecture disclosed allows the sequence of device formation to be rearranged with minimal impact on device performance. For example, the bipolar base implants may precede or follow the MOS gate formation steps. To maintain the self-aligned MOS transistor characteristic, the LDD implants follow gate formation but precede sidewall spacer formation, while the N+ and P+ source and drain implants occur subsequent to sidewall formation.

FIG. 13 shows a sequence of process steps that form a preferred embodiment of this invention. The substrate material of step 100 is preferably silicon with P-type doping that is low enough to sustain the maximum breakdown required by the highest-voltage devices to be fabricated, yet high enough to provide immunity to latch-up which may be exacerbated by excessive substrate resistance. In a preferred embodiment, the substrate does not include an epitaxial layer, since the addition of epitaxial layers can add significantly to the starting material cost. In other embodiments, however, it may be preferable to include an epitaxial layer on top of the substrate.

In step 101, a shallow trench mask is formed and shallow trenches are etched into the silicon substrate. These trenches are preferably compatible with the shallow trench isolation (STI) that is used for isolation among the devices to be formed. For example, the STI trenches may be on the order of 0.1-0.5 um wide and 0.1-0.5 um deep. Etching of the STI trenches as the first masking step also serves to form visible marks (the trench pattern itself) in the substrate for alignment of the subsequent mask layers.

In other embodiments of this process, the shallow trenches may be masked and etched after the well formation (shown in step 105 and described below). In this alternative sequence, the well doping profiles and junction depths may be less affected by the presence of the shallow trenches. It should be noted that shallow trench isolation does not provide complete isolation among devices. Rather, STI is analogous to LOCOS field oxide in that is laterally separates transistors from one another and prevents unwanted surface inversion and leakage between these transistors. However, STI does not provide complete electrical isolation between the devices and the underlying and surrounding substrate regions.

Step 102 shows the masking and implantation of the deep N-type (DN) regions that will form the floor isolation regions beneath individual isolated pockets, isolating these pockets vertically from the substrate. The DN mask may be photoresist with adequate thickness to block the DN implant. The DN implant is preferably formed by one or more high-energy implantation steps to introduce a relatively low-resistance layer deep in the substrate. For example, phosphorous may be implanted at an energy of about 3 MeV and dose of about $1\text{-}5\times10^{13}$ cm$^{-2}$ to produce a DN region that is located about 2 um below the surface and has a sheet resistance less than 500 ohms/square.

Step 103 includes the application of a second trench implant mask and etching of a second set of trenches into the silicon substrate. These trenches are preferably deeper than the trenches of step 101, extending from the surface at least down to the DN regions to provide lateral isolation of the isolated pockets from the substrate.

In a preferred embodiment, the shallow trenches have a shallower depth and a narrower width than the deeper trenches. In this manner, they may be inserted between devices with less adverse impact on die area and transistor packing density. For example, in one embodiment the deep trenches may be 1.6 microns deep and 0.4 microns wide, i.e. to etch and refill than high aspect ratio trenches, especially at high densities where loading effects can affect plasma or reactive ion etch speed and uniformity. At the shallow end of the range, the depth of the STI trenches is adequate to electrically separate N+ and P+ implants from overlapping or touching, but not deep enough to limit the lateral extent of deeper bipolar base implants. In an NPN bipolar, for example, an STI trench can then be inserted between the N+ emitter and P+ base contact implants, but the STI trench is inadequate to prevent lateral overlap of the PB base implant onto the N+ collector implant, which may impact the base-to-collector breakdown rating of the device. Conversely, if the depth of the STI trench is chosen to be at the high end of the stated range and deeper than the base implant, it cannot be inserted between the N+ emitter and the P+ base contact since it would disconnect the PB base from its P+ contact.

One key benefit of shallow trench isolation over LOCOS field oxide is the lack of a bird's beak, a sloped oxide region that interferes with MOS transistor operation in complex and undesirable ways and ultimately limits transistor packing density. In LOCOS field oxide regions having widths less than 0.4 microns, encroachment of the bird's beak from both sides results in excessive bird's beak length, oxide thinning, compromised electrical performance, and high stress. The more vertical profile of shallow trench isolation is better than LOCOS isolation, especially at dimensions less than 0.3 microns.

In other embodiments of this invention, the shallow trenches and/or the deep trenches may be left out entirely and their processing steps skipped. It is also in the scope of this invention to include more than two different trench etches.

In step 103, after etching of the deep trenches, the trenches are refilled. In a preferred embodiment, the width of deep and/or shallow trenches is varied depending on the function of the trench. Trenches with are to be completely filled with dielectric may be etched with a narrow width, while wider trenches are used if they are to be partially filled with dielectric and the remaining portion filled with conductive material.

To refill the trenches in this manner, a dielectric layer with good conformality, for example a TEOS deposited oxide is deposited. The deposition thickness is designed to completely refill narrow trenches, but only cover the sidewalls of wider trenches. For example, a 0.1 micron thickness could be used to completely refill a 0.2 um wide trench and form a 0.1 micron layer on each sidewall of a 0.4 micron wide trench, leaving a 0.2 micron wide space in the wide trench. The dielectric layer may then be etched back, preferably by reactive ion etching techniques, to entirely remove the dielectric from the bottom of the wide trenches. An optional implant may be introduced into the opening at the bottom of each wide trench. No masking layer is required, since the substrate is only exposed at the bottom of the wide trenches. This implant is preferably a high-dose, low-energy N-type implant, for example phosphorous at 30 keV and $1\times10^{15}$ cm$^{-2}$, which may improve the contact from the conductive fill (described below) to the DN floor isolation region.

A conductive layer is then deposited to complete the refill of the wide trenches. This layer is preferably highly conductive and conformal, such as in-situ doped polysilicon. The structure is then planarized back to the original surface of the substrate, preferably by Chemical-Mechanical Polishing (CMP).

Step 104 in FIG. 13 shows the option of performing the DN mask and implant after the completion of trench etch, refill, and planarization. This flow has an advantage over performing the DN process in step 102, in that the DN region is not subjected to the additional processing and thermal budget associated with the trench etch, refill, and planarization steps. Step 104 also shows masking and implantation of an optional deep P-type (DP) region, which is preferably formed using the high-energy implantation of boron. In a preferred embodiment, the DP region is implanted sufficiently deep such that it does not substantially change the surface concentration of overlying devices. For example, implant doses for the DP region may range from 1E12 cm$^{-2}$ to 1E14 cm$^{-2}$ but may typically range from 5E11 cm$^{-2}$ to 5E13 cm$^{-2}$.

Step 105 in FIG. 13 shows the formation of a high voltage drift region (HVN), which is preferably masked and implanted with energies up to or even exceeding that of the deepest N-type well implants, for example using phosphorus at energies up to 3 MeV. The HVN implant dose can be optimized for constructing high voltage transistors. The total implanted charge may be, for example, in the range of 1E12 cm$^{-2}$ to 5E12 cm-2. This step also shows the masking and implantation of an optional P-type region (PBD) to form the body of high-voltage transistors. The PBD implant may comprise multiple implants at different energies to optimize the threshold voltage, breakdown voltage, and performance of the high-voltage transistors.

Step 106 shows the formation of complementary wells, comprising a sequence of masking steps and implants with no subsequent high temperature diffusion and minimal dopant segregation. A pre-implant oxide may be thermally grown prior to implantation at a low temperature, e.g. 850° C. to 900° C., to a thickness of several hundred angstroms to minimize surface contamination. One pre-implant oxide may be used for several well implantations without the need to strip and re-grow the oxide. More than one P-type and N-type well maybe formed in different regions to facilitate fabrication of different voltage devices.

A first P-type well (PW1) may be formed using a boron chain implant resulting in a non-monotonic or non-Gaussian doping concentration profile which may include at least a top portion PW1A and a buried or deeper portion PW1B or any number of regions comprising implants of varying energy and dose. Deeper portion PW1B may be formed with a heavier dose implant and have a higher concentration than the upper well portion PW1A.

A second P-type well (PW2) may also be formed also using a boron chain implant resulting in a non-monotonic or non-Gaussian doping concentration profile which may include at least a top portion PW2A and a buried or deeper portion PW2B or any number of regions comprising implants of varying energy and dose. Deeper portion PW2B may also be formed with a heavier dose implant and have a higher concentration than the upper well portion PW2A. The concentration and doping profile of PW1 and PW2 may be dissimilar, and can be optimized for various voltage devices. For example PW1 may be optimized for constructing 1.5V NMOS transistors, while PW2 may be optimized for fabricating 12V NMOS transistors. In such a case the average concentration of PW1 may be higher than that of PW2.

In a similar fashion, a first N-type well (NW1) may be formed using a phosphorus chain implant resulting in a non-monotonic or non-Gaussian doping concentration profile which may include at least a top portion NW1A and a buried or deeper portion NW1B or any number of regions comprising implants of varying energy and dose. Deeper portion NW1B may be formed with a heavier dose implant and have a higher concentration than the upper well portion NW1A.

Likewise, a second N-type well (NW2) may be formed using a phosphorus chain implant resulting in a non-monotonic or non-Gaussian doping concentration profile which may include at least a top portion NW2A and a buried or deeper portion NW2B or any number of regions comprising implants of varying energy and dose. Deeper portion NW2B may also be formed with a heavier dose implant and have a higher concentration than the upper well portion NW2A. The concentration and doping profile of NW1 and NW2 are dissimilar, and can be optimized for various voltage devices. For example, NW1 may be optimized for constructing 1.5V PMOS transistors, while NW2 may be optimized for fabricating 12V PMOS transistors.

Applying the principle of modularity, additional P-type and N-type wells can be added without affecting other integrated devices. In a preferred embodiment, the aforementioned wells are implanted to a depth no deeper than the DN floor isolation layer. Accordingly, a P-type well sitting above a DN region should not substantially increase the sheet resistance of the DN region or significantly diminish the isolation effectiveness of the DN region.

Step 107 shows the formation of base regions for complementary bipolar transistors. By way of example, an NPN base region (PB) may be introduced by masking and implantation of boron. Similarly, a PNP base region (NB) may be introduced by masking and implantation of phosphorous. The base implants may comprise a single implant or a chain implant. In one example of a chain-implanted base region, the shallow portion may be more heavily doped and used to reduce base resistance, while the deeper portion may be more lightly doped and graded to optimize the current gain Early voltage of the device. The bipolar transistor may be formed using polysilicon or implanted emitters.

Step 108 shows the formation of the gates of the CMOS transistors. Single, dual, or multiple gate oxides may be formed to construct devices that are optimized for different operating voltages. In a dual-gate oxide process, for example, a first oxide may be grown at a low temperature, e.g. 850° C. to 900° C., to a given thickness $x_{ox1}$. The oxide is then masked and removed, generally by etching in HF acid, in regions where a thinner gate oxide is desired. Care must be taken during the etching not to remove significant oxide from the dielectrically filled trenches, either by covering them during the etch process or by limiting the etch time. Alternatively a capped trench, as described in application Ser. No. 11/298,075, filed Dec. 9, 2005, incorporated herein by reference, may be used to alleviate trench oxide erosion.

After the first gate oxide is removed from select active regions, the entire wafer may be oxidized a second time to grow a second gate oxide with thickness $x_{ox(thin)}$ in regions where no oxide was present at the time of the second oxidation. In regions where oxide remained prior to the second gate oxide, the oxide grows from its starting thickness $x_{ox1}$ to a new thickness $x_{ox(thick)}$ resulting from the two sequential oxidations.

In this dual-oxide process, the thicker oxide may be used for devices that support thinner oxide may be used for devices that support lower gate voltages; for example, a 125A oxide may be used for 5V devices.

After single or multiple gate oxide formation, a single gate polysilicon layer is deposited. In one embodiment, the gate polysilicon layer may be deposited already in-situ doped. The gate polysilicon may then be covered with a refractory metal such platinum, titanium or tungsten to forming a low-resistance silicide. The gate may then be masked and etched.

In another embodiment, the gate polysilicon layer may be deposited un-doped, lightly doped with a blanket implant, and then masked and etched. Regions of this layer may be protected from subsequent doping and used to form high-value resistors. In this embodiment, the gate polysilicon layer may be doped later in the process, using the same N+ or P+ implants that are used to form the source and drain regions of the NMOS or PMOS devices. Some portions of the gate polysilicon can then be protected by a layer such as oxide, and the exposed polysilicon regions may be covered with a refractory metal to form self-aligned (to the protection layer) silicide regions.

In yet another embodiment, the thicker gate oxide may be grown and covered with a first polysilicon layer which is in-situ doped and subsequently masked and etched. Unwanted thick gate oxide regions may then be removed. The thin gate oxide may then be grown and covered with a second polysilicon layer, this one being un-doped, and subsequently masked and doped to form both P-type and N-type polysilicon regions. The second polysilicon layer may then be covered with a refractory metal and reacted to form silicide, then masked and etched to form the low-voltage gates. In this alternative flow, the higher-voltage thick-gate devices do not have a silicide, and consequently the maximum switching speed of the higher-voltage thick-gate devices may be lower. One advantage of this flow is it is possible to form a poly-to-poly capacitor between the first and the second polysilicon layers.

In an alternative flow, the base implants of step 107 may be introduced after the gate oxidation steps, having the advantage that the gate oxidation process has no impact on the base dopant profiles if oxidation precedes base implantation. This flow is especially advantageous for polysilicon emitter bipolar transistor formation where the base is necessarily very shallow for high frequency operation.

Step 109 shows the formation of an optional P-type tilt body (PTB) that is introduced through a mask using a large-angle tilt implant (LATID). To form the body of an N-channel lateral DMOS, for example, a boron implant in the range of $1E13$ cm$^{-2}$ to $5E14$ cm$^{-2}$ may be introduced at a 45 degree angle, penetrating into the silicon beneath the polysilicon gate. To guarantee uniformity for all orientation gates, the wafers should be mechanically rotated during ion implantation. The LATID process allows formation of a PTB region that is self-aligned to the polysilicon gate edge and has a relatively large underlap of the gate (e.g. 0.3-0.6 microns) without need for a long diffusion to diffuse the PTB under the gate (instead, it is implanted under the gate by the LATID). Step 109 also shows the formation of lightly-doped drain (LDD) regions, which are masked and implanted sequentially. Multiple LDD regions may be formed and optimized for each type of CMOS device included in a given modular flow. For example, more heavily doped LDD regions for lower voltage CMOS devices (NLDD1 and PLDD1) may be formed along with separate, more lightly doped LDD regions for higher voltage devices (NLDD2 and PLDD2)

After the LDD implants, step 110 shows sidewall spacer formation using conventional methods, such as deposition of a thick oxide or other spacer layer, followed by an anisotropic etch to remove the spacer layer from all areas except along the sidewalls of the etched gate polysilicon regions. Step 110 also shows the formation of N+ and P+ source and drain implants. These are individually masked and typically implanted using arsenic and BF$_2$ respectively. An optional additional implant may also be introduced to improve ESD performance. In a preferred embodiment, described above, the N+ and P+ implants are also used to dope the exposed polysilicon gate regions above the NMOS and PMOS devices, thus providing the same doping type of the gate polysilicon and the source and drain regions in each device type. A masking layer, such as oxide, may also be deposited, masked, and etched, so that self-aligned silicide may then be formed on the unmasked areas of gate polysilicon and/or source and drain regions.

Step 111 shows the formation of the first interlevel dielectric layer (ILD) that separates the substrate from the overlying metal layer. This layer is preferably a silicon dioxide or another suitable dielectric, with a thickness in the range of 0.3-1.0 microns. In the event that high-frequency polysilicon emitter bipolar transistors are to be included in a given process flow, polysilicon emitter windows are opened in the ILD and polysilicon is deposited. The polysilicon may be doped in-situ or deposited un-doped followed by masking and ion implantation to form P-type and N-type polysilicon emitters. The wafers are then annealed using a rapid-thermal-anneal (RTA) process to activate the implanted dopants. Aside from the trench refill, gate oxidation, and polysilicon deposition processes, this step comprises a significant portion of the thermal budget of the process. This characteristic is unique as compared to most isolated IC processes, which have substantial high temperature processing associated with isolation and well formation. The RTA cycle may comprise, for example, a temperature of 1000-1100 C for a time of several seconds to a few minutes.

Step 112 shows the formation of multilayer interconnects. The interconnect process commences with contact mask and etching of the first ILD, followed by contact plug formation, preferably using deposition and planarization of a refractory metal such as tungsten. The first metallization layer is deposited, using for example aluminum, copper, or an alloy. The metallization layer may also comprise one or more underlying barrier layers and one or more overlying barrier layers to improve adhesion, contact resistance or photo processing. The thickness of the total metal stack depends on the minimum line width to be etched but typically may be 1.0 microns or less. The first metallization layer is masked and etched. Additional layers of ILD and metallization are deposited and etched in a similar fashion to provide the required number of interconnect layers.

In step 113 a passivation layer such as silicon oxide or silicon nitride is deposited, masked and etched to define bond pad openings. Alternatively, another dielectric layer can be deposited instead of the passivation layer, and a final via mask can be etched. An optional fourth layer metal may then be deposited and used to redistribute the pad locations uniformly across the chip for bump assembly, typically in a regular grid array on 0.5 mm centers. For this reason, the metal can be referred to as a RDL or redistribution layer. The pad mask is then deposited and etched in the bump locations and a three layer sandwich of thin metal is deposited, e.g. comprising titanium as an ohmic contact layer, followed by nickel as a barrier layer, and finally silver as a solderable metal. Silver solder bumps are then plated on the wafer and the finalized wafer is ready for dicing.

The embodiments described herein are intended to be illustrative and not limiting. Many alternative embodiments within the broad scope of this invention will be obvious to persons of skill in the art from the descriptions herein.

We claim:

1. An isolated bipolar transistor formed in a semiconductor substrate of a first conductivity type, the substrate not comprising an epitaxial layer, the isolated bipolar transistor comprising:
    a floor isolation region of a second conductivity type opposite to the first conductivity type submerged in the substrate;
    a first filled trench extending downward from a surface of the substrate at least to the floor isolation region, the first filled trench comprising a dielectric material, wherein the floor isolation region and the first filled trench together enclose an isolated pocket of the substrate,
    an emitter region of the second conductivity type located in the isolated pocket adjacent a surface of the substrate;
    a base region of the first conductivity type located in the isolated pocket adjacent the emitter region, the base region comprising a base contact region, the base contact region having a higher doping concentration than a remaining portion of the base region;
    a dielectric-filled trench extending downward from the surface of the substrate and separating the emitter region and the base contact region; and
    a collector region of the second conductivity type, the collector region comprising the floor isolation region and being located adjacent the base region.

2. The isolated bipolar transistor of claim 1 wherein the dielectric-filled trench has a vertical depth that is less than a vertical depth of the first filled trench.

3. The isolated bipolar transistor of claim 1 wherein the dielectric-filled trench has a lateral width that is less than a lateral width of the first filled trench.

4. The isolated bipolar transistor of claim 1 wherein the dielectric-filled trench laterally encloses the emitter region, the base contact region laterally encloses the dielectric-filled trench, and the first filled trench laterally encloses the base contact region.

5. The isolated bipolar transistor of claim 1 wherein the first filled trench further comprises a conductive material, the conductive material being laterally surrounded by the dielectric material.

6. The isolated bipolar transistor of claim 5 wherein the conductive material provides electrical contact from the collector region to the surface of the substrate.

7. The isolated bipolar transistor of claim 1 wherein the first filled trench is filled with the dielectric material.

8. The isolated bipolar transistor of claim 1 wherein the isolated pocket further comprises a well of the second conductivity type extending from the surface of the substrate to the floor isolation region.

9. The isolated bipolar transistor of claim 8 further comprising a second dielectric-filled trench extending downward from the surface of the substrate at least to the floor isolation region, the second dielectric-filled trench being located between the well and the base region.

10. The isolated bipolar transistor of claim 1 wherein the emitter region comprises an emitter contact region, the emitter contact region having a higher doping concentration than a remaining portion of the emitter region.

11. The isolated bipolar transistor of claim 3 wherein the first filled trench comprises a layer of dielectric material along the wall of the trench and a conductive material extending from the top of the trench to the floor isolation region.

12. An isolated bipolar transistor formed in a semiconductor substrate of a first conductivity type, the substrate not comprising an epitaxial layer, the isolated bipolar transistor comprising:
   a collector region of a second conductivity type opposite to the first conductivity type submerged in the substrate;
   a first filled trench extending downward from a surface of the substrate, the first filled trench comprising a conductive material, the conductive material being laterally surrounded by a dielectric material,
   a base region of the first conductivity type located in the substrate above the collector region, the base region comprising a base contact region, the base contact region having a higher doping concentration than a remaining portion of the base region;
   a dielectric-filled trench extending downward from the surface of the substrate and separating the emitter region and the base contact region; and
   an emitter region of the second conductivity type located above the base region and adjacent a surface of the substrate;

13. An isolated bipolar transistor formed in a semiconductor substrate of a first conductivity type, the substrate not comprising an epitaxial layer, the isolated bipolar transistor comprising:
   a floor isolation region of a second conductivity type opposite to the first conductivity type submerged in the substrate;
   a filled trench extending downward from a surface of the substrate at least to the floor isolation region, the filled trench comprising a dielectric material, wherein the floor isolation region and the filled trench together enclose an isolated pocket of the substrate,
   an emitter region of the first conductivity type located in the isolated pocket adjacent a surface of the substrate;
   a base region of the second conductivity type located in the isolated pocket adjacent the emitter region, the base region comprising a base contact region, the base contact region having a higher doping concentration than a remaining portion of the base region;
   a dielectric-filled trench extending downward from the surface of the substrate and separating the emitter region and the base contact region; and
   a collector region of the first conductivity type located adjacent the base region.

14. The isolated bipolar transistor of claim 13 wherein the collector region comprises a collector contact region, the collector contact region having a higher doping concentration than a remaining portion of the collector region, the isolated bipolar transistor further comprising a second dielectric-filled trench extending downward from the surface of the substrate and separating the base contact region and the collector contact region.

15. The isolated bipolar transistor of claim 13 wherein the first dielectric-filled trench has a vertical depth that is less than a vertical depth of the filled trench.

16. The isolated bipolar transistor of claim 13 wherein the first dielectric-filled trench has a lateral width that is less than a lateral width of the filled trench.

17. The isolated bipolar transistor of claim 14 wherein the first dielectric-filled trench laterally encloses the emitter region, the base contact region laterally encloses the first dielectric-filled trench, the second dielectric-filled trench laterally encloses the base contact region, the collector contact region laterally encloses the second dielectric-filled trench, and the filled trench laterally encloses the collector contact region.

* * * * *

UNITED STATES PATENT AND TRADEMARK OFFICE
CERTIFICATE OF CORRECTION

PATENT NO. : 7,902,630 B2  
APPLICATION NO. : 12/069940  
DATED : March 8, 2011  
INVENTOR(S) : Disney Page 1 of 1

It is certified that error appears in the above-identified patent and that said Letters Patent is hereby corrected as shown below:

On the title page, Item [60] should read as follows:

Continuation-in-part of application No. 11/890,993, filed on Aug. 8, 2007, now Pat. No. 8,097,522, which is a continuation of application No. 11/444,102, filed on May 31, 2006, now Pat. No. 7,825,488, and a continuation-in-part of application No. 10/918,316, filed on Aug. 14, 2004, now Pat. No. 7,422,938, which is a division of application No. 10/218,668, filed on Aug. 14, 2002, now Pat. No. 6,900,091; application No. 11/890,993 is also a continuation-in-part of application No. 11/204,215, filed on Aug. 15, 2005, now Pat. No. 7,489,016, which is a division of application No. 10/218,678, filed on Aug. 14, 2002, now Pat. No. 6,943,426.

Signed and Sealed this  
Eleventh Day of March, 2014

Michelle K. Lee  
*Deputy Director of the United States Patent and Trademark Office*